(12) United States Patent
Okutani et al.

(10) Patent No.: US 11,524,314 B2
(45) Date of Patent: Dec. 13, 2022

(54) SUBSTRATE PROCESSING METHOD AND SUBSTRATE PROCESSING DEVICE

(71) Applicant: SCREEN Holdings Co., Ltd., Kyoto (JP)

(72) Inventors: Manabu Okutani, Kyoto (JP); Hiroshi Abe, Kyoto (JP); Takaaki Ishizu, Kyoto (JP)

(73) Assignee: SCREEN Holdings Co., Ltd., Kyoto (JP)

( * ) Notice: Subject to any disclaimer, the term of this patent is extended or adjusted under 35 U.S.C. 154(b) by 0 days.

(21) Appl. No.: 16/935,204

(22) Filed: Jul. 22, 2020

(65) Prior Publication Data

US 2021/0031228 A1 Feb. 4, 2021

(30) Foreign Application Priority Data

Jul. 29, 2019 (JP) .............................. JP2019-138966

(51) Int. Cl.
*B05D 3/00* (2006.01)
*B05C 11/06* (2006.01)
*B05D 7/00* (2006.01)

(52) U.S. Cl.
CPC .............. *B05C 11/06* (2013.01); *B05D 3/007* (2013.01); *B05D 7/56* (2013.01)

(58) Field of Classification Search
CPC .............. B05D 3/007; H01L 21/02041; H01L 21/02052
See application file for complete search history.

(56) References Cited

U.S. PATENT DOCUMENTS

| | | | | |
|---|---|---|---|---|
| 2008/0078423 | A1* | 4/2008 | Araki | H01L 21/68742 134/22.19 |
| 2008/0142054 | A1* | 6/2008 | Eitoku | H01L 21/6708 134/30 |
| 2014/0216506 | A1 | 8/2014 | Inatomi | |
| 2014/0261570 | A1* | 9/2014 | Orii | H01L 21/02052 134/31 |
| 2016/0214148 | A1* | 7/2016 | Okutani | H01L 21/02057 |
| 2017/0043379 | A1 | 2/2017 | Sasaki et al. | |
| 2017/0282210 | A1 | 10/2017 | Okutani et al. | |

(Continued)

FOREIGN PATENT DOCUMENTS

| | | |
|---|---|---|
| JP | 2008034553 | 2/2008 |
| JP | 2010050143 | 3/2010 |

(Continued)

*Primary Examiner* — Nathan H Empie
(74) *Attorney, Agent, or Firm* — JCIPRNET

(57) ABSTRACT

In a second liquid supply step, a second liquid film and a first liquid film surrounding a side of the second liquid film are formed on an upper surface of a substrate. Then, in a vapor layer formation step, by heating the substrate, a second vapor layer is formed by evaporating the second liquid contacting the upper surface of the substrate, and the second liquid film is held on the second vapor layer. Since the second liquid included in the second liquid film has a high vapor pressure, a height position of a lower surface of the floating second liquid film may be kept high. By blowing a gas to the floating second liquid film, a hole is formed in the second liquid film, and by expanding the hole toward an outer periphery of the substrate, the first liquid and the second liquid are removed outside the substrate.

7 Claims, 12 Drawing Sheets

(56) References Cited

U.S. PATENT DOCUMENTS

| | | | |
|---|---|---|---|
| 2018/0204743 A1 | 7/2018 | Otsuji et al. | |
| 2018/0269506 A1 | 9/2018 | You et al. | |
| 2019/0027383 A1* | 1/2019 | Nakai | F26B 5/08 |
| 2019/0088469 A1 | 3/2019 | Tanaka et al. | |

FOREIGN PATENT DOCUMENTS

| | | | |
|---|---|---|---|
| JP | 2017041512 | 2/2017 | |
| KR | 20190033427 | 3/2019 | |
| WO | WO-2017159052 A1 * | 9/2017 | C11D 7/5022 |
| WO | 2020213481 | 10/2020 | |

\* cited by examiner

SUBSTRATE PROCESSING METHOD AND SUBSTRATE PROCESSING DEVICE

CROSS REFERENCE TO RELATED APPLICATIONS

This application claims the priority benefit of Japan application serial no. 2019-138966, filed on Jul. 29, 2019. The entirety of the above-mentioned patent application is hereby incorporated by reference herein and made a part of this specification.

BACKGROUND OF THE INVENTION

1. Field of the Invention

The disclosure relates to a substrate processing method and a substrate processing device. Examples of substrates to be processed include semiconductor wafers, substrates for flat panel display (FPD) such as a liquid crystal display device and an organic electroluminescence (EL) display device, optical disk substrates, magnetic disk substrates, magneto-optical disk substrates, photomask substrates, ceramic substrates, solar cell substrates, and the like.

2. Description of Related Art

In the manufacturing process of semiconductor devices, FPDs and the like, substrates such as semiconductor wafers and glass substrates for FPDs are processed according to the needs.

Conventionally, various methods for drying a substrate while suppressing pattern collapse have been proposed. In the method described in US 2017/282210 A1, after a rinse processing with a rinse liquid, the rinse liquid on the substrate held horizontally is replaced with an organic solvent, and a liquid film of the organic solvent covering the entire upper surface of the substrate is formed. Then, the heater is brought close to the lower surface of the substrate held horizontally to heat the substrate. As a result, the organic solvent in contact with the substrate is evaporated to form a vapor layer on the upper surface of the substrate, and the liquid film of the organic solvent is kept on the vapor layer. In this state, a gas is blown to the liquid film of the organic solvent to partially remove the organic solvent from the liquid film of the organic solvent, thereby making a hole in the liquid film of the organic solvent. As a result, a gas-liquid interface is formed on the upper surface of the substrate. Then, by expanding the hole, the liquid film of the organic solvent moves on the vapor layer, and the gas-liquid interface moves toward the outer periphery of the substrate. When the gas-liquid interface reaches the outer peripheral edge of the substrate, the upper surface of the substrate is dried while the pattern collapse is suppressed.

SUMMARY OF THE INVENTION

In the drying method described in US 2017/282210 A1, when the pattern height (height of the convex pattern) is larger than the thickness of the vapor layer formed on the substrate, as shown in FIG. 11A, the liquid film of the organic solvent on the vapor layer may contact the upper part of the pattern. When the drying method described in US 2017/2821010 A1 is performed in such a state, the pattern collapse may occur.

Specifically, in the state shown in FIG. 11A, a gas is blown onto the floating liquid film of the organic solvent, thereby forming a hole in the liquid film of the organic solvent. Next, the hole is expanded. When the hole is formed or when the hole is expanded, the surface tension of the organic solvent in contact with the pattern is applied to the upper part of the pattern, and as shown in FIG. 11B, the pattern may collapse at the gas-liquid interface or the inner side thereof.

The disclosure provides a substrate processing method and a substrate processing device capable of drying the substrate while suppressing the pattern collapse.

An embodiment of the disclosure provides a substrate processing method including: a liquid film formation step of supplying a first liquid and a second liquid having a vapor pressure higher than a vapor pressure of the first liquid to an upper surface of a substrate held horizontally, and forming, on the upper surface of the substrate, a second liquid film including the second liquid and a first liquid film including the first liquid and surrounding a side of the second liquid film; a vapor layer formation step of evaporating at least the second liquid in contact with the upper surface of the substrate by heating the substrate, forming a second vapor layer including vapor of the second liquid between the second liquid and the upper surface of the substrate, and holding the second liquid film on the second vapor layer; and a gas blowing removal step of making a hole in the second liquid film by blowing a gas to the second liquid film to partially remove the second liquid after the second vapor layer is formed, further expanding the hole toward an outer periphery of the substrate, and removing the first liquid and the second liquid outside the substrate by moving the second liquid film on the second vapor layer.

According to this method, in the second liquid supply step, the second liquid film and the first liquid film in a ring shape surrounding the side of the second liquid film are formed on the upper surface of the substrate. Then, in the vapor layer formation step, by heating the substrate, the second vapor layer is formed by evaporating the second liquid in contact with the upper surface of the substrate, and the second liquid film is held on the second vapor layer. That is, the second liquid film is held in a state of floating above the upper surface of the substrate. Since the vapor pressure of the second liquid included in the second liquid film is high, a film thickness of the second vapor layer is large. Therefore, a height position of a lower surface of the floating second liquid film may be kept high. Therefore, the lower surface of the second liquid film may be disposed above an upper end of the pattern.

By blowing the gas to the floating second liquid film, the hole is formed in the second liquid film. In this way, the outer edge of the hole, that is, a gas-liquid interface is formed. Then, by expanding the hole toward the outer periphery of the substrate, the second liquid film is moved while floating and is removed to the outside of the substrate. Since the frictional resistance acting on the second liquid film on the substrate is so small that it may be regarded as zero, the second liquid film may be removed from the substrate by a small force called a pressing force by the flow of the gas.

While the hole is being expanded, the second liquid film moves while maintaining the state where the side of the second liquid film is surrounded by the first liquid film. Therefore, the gas-liquid interface is continuously provided on the second liquid film. Moreover, since the height position of the lower surface of the floating second liquid film is kept high by the second vapor layer, during the period when the hole is being expanded, the gas-liquid interface provided on the second liquid film may be continuously disposed above the upper end of the pattern. Therefore, over the entire period when the hole is being expanded, the pattern may be prevented from coming into contact with the second liquid at the gas-liquid interface. In this case, over the entire period when the hole is being expanded, the surface tension of the second liquid may be prevented from acting on the upper part of the pattern at the gas-liquid interface. In this way, the substrate may be dried while suppressing the collapse of the pattern.

In an embodiment of the disclosure, a surface tension of the second liquid is lower than a surface tension of the first liquid.

According to this method, the surface tension of the second liquid is lower than the surface tension of the first liquid. That is, the surface tension of the first liquid included in the first liquid film in a ring shape surrounding the side of the second liquid film is high. The side of the second liquid film is surrounded by the first liquid film, whereby the outflow of the second liquid from the substrate is blocked by the first liquid film. In the entire liquid film including the first liquid film and the second liquid film, the shape of the liquid film is kept by the surface tension of the liquid included in the outer peripheral part of the liquid film. Since the outer peripheral part of the entire liquid film is formed by the first liquid having a high surface tension, the shape of the liquid film may be kept for the entire liquid film including the first liquid film and the second liquid film.

Assume a case where the liquid film on the substrate is formed only by the second liquid film without the first liquid film provided, since the surface tension of the second liquid is low, it may not be possible to secure a sufficient heating time for forming a vapor layer having a sufficient thickness, and as a result, it may not be possible to float the liquid film on the substrate well.

On the other hand, as in this method, the side of the second liquid film is surrounded by the first liquid film, whereby the film thickness of the second liquid film may be made sufficiently thick. Since the film thickness of the second liquid film is sufficiently thick, the second liquid film may be heated for a sufficient time without forming unintended cracks or holes in the second liquid film, whereby the thickness of the vapor layer may be sufficiently thick. Therefore, the second liquid film may be floated well.

Further, also assume a case where due to the height of the pattern, the upper end of the pattern may be at the same height position as the lower surface of the floating second liquid film or may be located above the lower surface. In this case, during the period when the hole is being expanded, the pattern keeps contacting the second liquid at the gas-liquid interface, and the surface tension of the second liquid acts on the upper part of the pattern at the gas-liquid interface. However, since the surface tension of the second liquid is low, the surface tension acting on the pattern is low. In this way, the collapse of the pattern may be suppressed. Therefore, even in the case where the pattern contacts the floating second liquid film, the substrate may be dried while suppressing the collapse of the pattern.

In an embodiment of the disclosure, the liquid film formation step includes: supplying the first liquid to the upper surface of the substrate; and supplying the second liquid to the upper surface of the substrate to replace only a part of the first liquid on the upper surface of the substrate with the second liquid.

According to this method, only a part of the first liquid on the upper surface of the substrate is replaced with the second liquid. In this way, the first liquid film in a ring shape remains at least on the outer peripheral part of the upper surface of the substrate, and the second liquid gathers inside the first liquid film. In this way, the second liquid film and the first liquid film surrounding the side of the second liquid film may be formed relatively easily on the upper surface of the substrate.

In an embodiment of the disclosure, the liquid film formation step includes: discharging the first liquid from a first liquid nozzle toward an outer peripheral part of the upper surface of the substrate; and discharging the second liquid from a second liquid nozzle different from the first liquid nozzle toward a central part of the upper surface of the substrate.

According to this method, the supply of the first liquid for forming the first liquid film and the supply of the second liquid for forming the second liquid film may be realized by liquid discharge from different nozzles. In this way, the second liquid film and the first liquid film surrounding the side of the second liquid film may be formed relatively easily on the upper surface of the substrate.

In an embodiment of the disclosure, a specific gravity of the second liquid is larger than a specific gravity of the first liquid.

According to this method, since the specific gravity of the second liquid is large, at the interface between the first liquid and the second liquid, the second liquid enters between the first liquid and the substrate due to the difference in specific gravity. The liquid deep inside the grooves among the pattern may also be replaced with the second liquid. In this way, the liquid among the pattern may be well replaced with the second liquid.

Another embodiment of the disclosure provides a substrate processing device, including: a substrate holding unit which holds a substrate horizontally; a first liquid supply unit which supplies a first liquid to an upper surface of the substrate held by the substrate holding unit; a second liquid supply unit which supplies a second liquid having a vapor pressure higher than a vapor pressure of the first liquid to the upper surface of the substrate held by the substrate holding unit; a heater which heats the substrate held by the substrate holding unit; a gas blowing unit which blows a gas to the substrate held by the substrate holding unit; and a control device which controls the first liquid supply unit, the second liquid supply unit, the heater, and the gas blowing unit, wherein the control device executes: a liquid film formation step of supplying the first liquid and the second liquid to the upper surface of the substrate by the first liquid supply unit and the second liquid supply unit, and forming, on the upper surface of the substrate, a second liquid film including the second liquid and a first liquid film including the first liquid and surrounding a side of the second liquid film; a vapor layer formation step of evaporating at least the second liquid in contact with the upper surface of the substrate by heating the substrate by the heater, forming a second vapor layer between the second liquid and the upper surface of the substrate, and holding the second liquid film on the second vapor layer; and a gas blowing removal step of making a hole in the second liquid film by blowing a gas to the second liquid film by the gas blowing unit to partially remove the second liquid after the second vapor layer is formed, further expanding the hole toward an outer periphery of the substrate, and removing the first liquid included in the first liquid film and the second liquid included in the second liquid film outside the substrate by moving the second liquid film on the second vapor layer.

According to this configuration, in the second liquid supply step, the second liquid film and the first liquid film in a ring shape surrounding the side of the second liquid film are formed on the upper surface of the substrate. Then, in the vapor layer formation step, by heating the substrate, the second vapor layer is formed by evaporating the second liquid in contact with the upper surface of the substrate, and the second liquid film is held on the second vapor layer. That is, the second liquid film is held in a state of floating above the upper surface of the substrate. Since the vapor pressure of the second liquid included in the second liquid film is high, a film thickness of the second vapor layer is large. Therefore, a height position of a lower surface of the floating second liquid film may be kept high. Therefore, the lower surface of the second liquid film may be disposed above an upper end of the pattern.

By blowing the gas to the floating second liquid film, the hole is formed in the second liquid film. In this way, the outer edge of the hole, that is, a gas-liquid interface is formed. Then, by expanding the hole toward the outer periphery of the substrate, the second liquid film is moved while floating and is removed to the outside of the substrate. Since the frictional resistance acting on the second liquid film on the substrate is so small that it may be regarded as zero, the second liquid film may be removed from the substrate by a small force called a pressing force by the flow of the gas.

While the hole is being expanded, the second liquid film moves while maintaining the state where the side of the second liquid film is surrounded by the first liquid film. Therefore, the gas-liquid interface is continuously provided on the second liquid film. Moreover, since the height position of the lower surface of the floating second liquid film is kept high by the second vapor layer, during the period when the hole is being expanded, the gas-liquid interface provided on the second liquid film may be continuously disposed above the upper end of the pattern. Therefore, over the entire period when the hole is being expanded, the pattern may be prevented from coming into contact with the second liquid at the gas-liquid interface. In this case, over the entire period when the hole is being expanded, the surface tension of the second liquid may be prevented from acting on the upper part of the pattern at the gas-liquid interface. In this way, the substrate may be dried while suppressing the collapse of the pattern.

The above-mentioned or other objects, features and effects of the disclosure will become apparent from the following description of embodiments with reference to the accompanying drawings.

DETAILED DESCRIPTION OF PREFERRED EMBODIMENTS

Figure 1A:
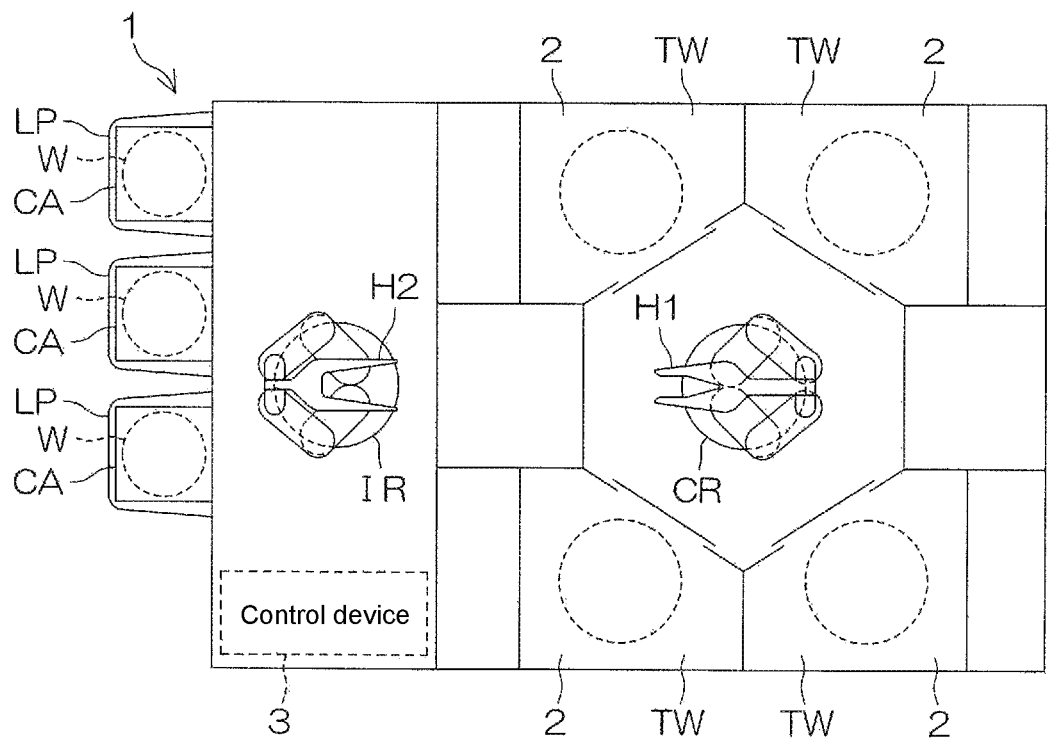
FIG. 1A is a schematic view of a substrate processing device according to an embodiment of the disclosure as viewed from above.
Figure 1B:
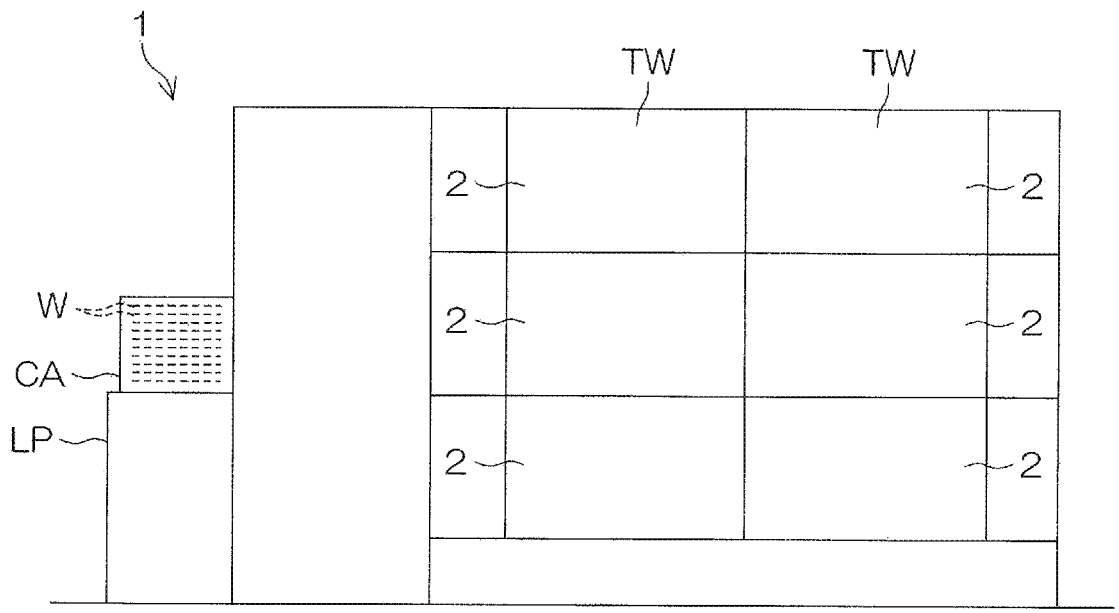
FIG. 1B is a schematic view of the substrate processing device as viewed from the side.

FIG. 1A is a schematic view of a substrate processing device 1 according to an embodiment of the disclosure as viewed from above. FIG. 1B is a schematic view of the substrate processing device 1 as viewed from the side.

As shown in FIG. 1A, the substrate processing device 1 is a single-wafer processing device that processes disk-shaped substrates W such as semiconductor wafers one by one. The substrate processing device 1 includes a load port LP which holds a carrier CA for housing a substrate W, a plurality of processing units 2 which process the substrate W transferred from the carrier CA on the load port LP with a processing fluid such as a processing liquid or a processing gas, a transfer robot which transfers the substrate W between the carrier CA on the load port LP and the processing unit 2, and a control device 3 which controls the substrate processing device 1.

The transfer robot includes an indexer robot IR for loading and unloading the substrate W with respect to the carrier CA on the load port LP, and a center robot CR for loading and unloading the substrate W with respect to the plurality of processing units 2. The indexer robot IR transfers the substrate W between the load port LP and the center robot CR, and the center robot CR transfers the substrate W between the indexer robot IR and the processing unit 2. The center robot CR includes a hand H1 which supports the substrate W, and the indexer robot IR includes a hand H2 which supports the substrate W.

The plurality of processing units 2 form a plurality of towers TW disposed around the center robot CR in a plan view. FIG. 1A shows an example in which four towers TW are formed. The center robot CR may access any one of the towers TW. As shown in FIG. 1B, each tower TW includes a plurality of processing units 2 (for example, three processing units 2) stacked vertically.

Figure 2:
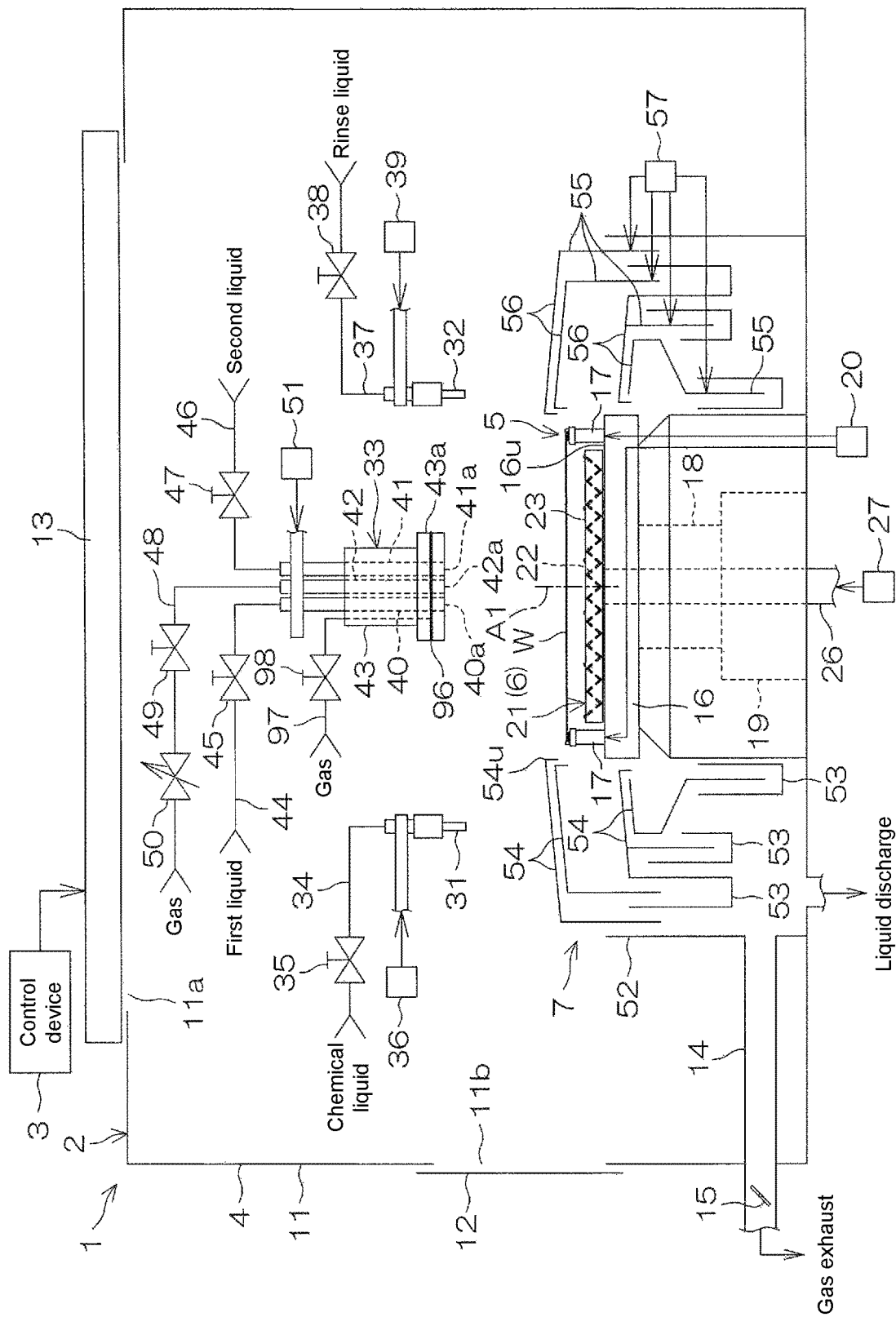
FIG. 2 is a schematic view of the inside of the processing units provided in the substrate processing device as viewed horizontally.
Figure 3:
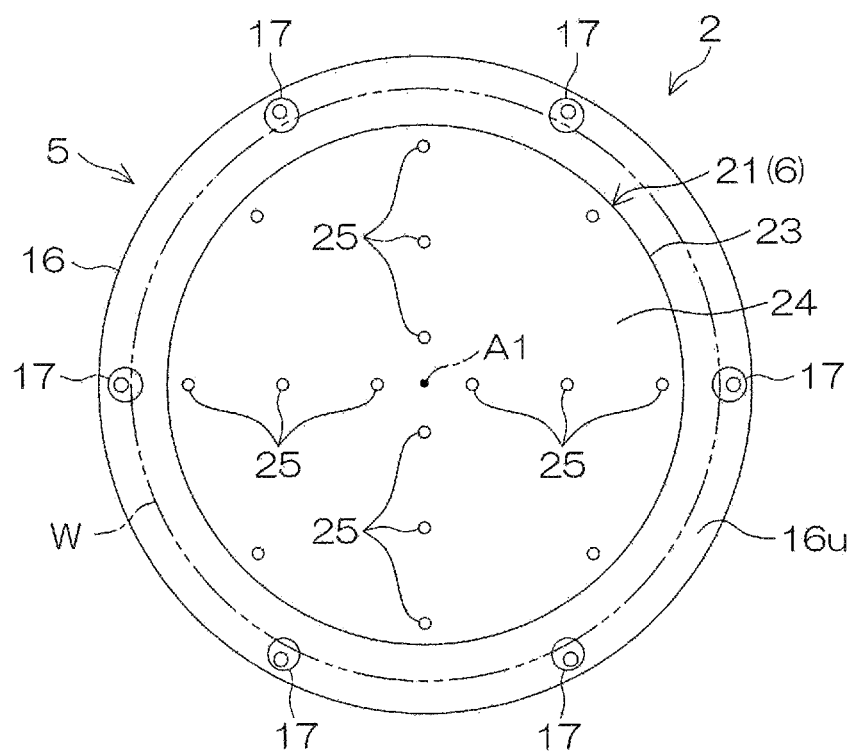
FIG. 3 is a schematic view of a spin chuck and a hot plate shown in FIG. 2 as viewed from above.

FIG. 2 is a schematic view of the inside of the processing units 2 provided in the substrate processing device 1 as viewed horizontally. FIG. 3 is a schematic view of a spin chuck 5 and a hot plate 21 as viewed from above.

As shown in FIG. 2, the processing unit 2 is a wet processing unit which supplies a processing liquid to the substrate W. The processing unit 2 includes a box-shaped chamber 4 having an internal space, a spin chuck (substrate holding unit) 5 which holds one substrate W horizontally in the chamber 4 and rotates it around a vertical rotation axis A1 passing through the central part of the substrate W, a plurality of nozzles which discharge processing fluids (processing liquids and processing gases) toward the substrate W held by the spin chuck 5, a heater 6 which heats the substrate W from below, and a cylindrical processing cup 7 which surrounds the spin chuck 5 around the rotation axis A1.

As shown in FIG. 2, the chamber 4 includes a box-shaped partition wall 11 provided with a loading and unloading port 11b through which the substrate W passes, and a shutter 12 which opens and closes the loading and unloading port 11b. A fan filter unit (FFU) 13 is disposed on a ventilation port 11a provided on the upper part of the partition wall 11. The FFU 13 constantly supplies clean air (air filtered by a filter) to the inside of the chamber 4 from the ventilation port 11a. Gas in the chamber 4 is removed from the chamber 4 through an exhaust duct 14 connected to the bottom part of the processing cup 7. As a result, a downflow of the clean air is constantly formed inside the chamber 4. The flow rate of the exhaust gas removed to the exhaust duct 14 is changed according to the opening degree of an exhaust valve 15 disposed in the exhaust duct 14.

As shown in FIG. 2, the spin chuck 5 includes a disk-shaped spin base 16 held in a horizontal posture, a plurality of chuck pins 17 which hold the substrate W in a horizontal posture above the spin base 16, a spin shaft 18 which extends vertically downward from the central part of the spin base 16 along the rotation axis A1, and a spin motor 19 which rotates the spin base 16 and the plurality of chuck pins 17 by rotating the spin shaft 18. The plurality of chuck pins 17 are disposed on the outer peripheral part of an upper surface 16u of the spin base 16 at intervals in the circumferential direction. The plurality of chuck pins 17 may be opened and closed between a closed state of contacting the peripheral edge of the substrate W and holding the substrate W and an open state of retracting from the peripheral edge of the substrate W. In the open state, the plurality of chuck pins 17 contact the lower surface of the outer peripheral part of the substrate W to support the substrate W from below.

As shown in FIG. 2, a chuck pin driving unit 20 for driving the chuck pin 17 to open and close is combined to the chuck pin 17. The chuck pin driving unit 20 includes, for example, a link mechanism housed inside the spin base 16 and a driving source disposed outside the spin base 16. The driving source includes, for example, a ball screw mechanism and an electric motor which gives a driving force to the ball screw mechanism. A specific configuration example of the chuck pin driving unit 20 is described in Japanese Patent Application Laid-Open No. 2008-034553.

As shown in FIGS. 2 and 3, the heater 6 includes the hot plate 21 disposed between the substrate W and the spin base 16. The hot plate 21 includes a heating element 22 which generates Joule heat when electrically energized, and an outer case 23 which houses the heating element 22. The heating element 22 and the outer case 23 are disposed below the substrate W. The heating element 22 is connected to a wiring (not shown) which supplies electric power to the heating element 22. The temperature of the heating element 22 is changed by the control device 3. The central line of the hot plate 21 is disposed on the rotation axis A1 of the substrate W. Even if the spin chuck 5 rotates, the hot plate 21 does not rotate.

As shown in FIG. 3, the outer case 23 of the hot plate 21 includes a disk-shaped base part 24 disposed below the substrate W, and a plurality of hemispherical protruding parts 25 protruding upward from the upper surface of the base part 24. The upper surface of the base part 24 is parallel (that is, horizontal) to the lower surface of the substrate W and has an outer diameter smaller than the diameter of the substrate W. The plurality of protruding parts 25 contact the lower surface of the substrate W at positions upward away from the upper surface of the base part 24. The plurality of protruding parts 25 are disposed at a plurality of positions within the upper surface of the base part 24 to support the substrate W horizontally. The substrate W is horizontally supported with the lower surface of the substrate W upward away from the upper surface of the base part 24 by a minute distance (for example, within fractions of a millimeter).

When the control device 3 causes the heating element 22 to generate heat, the upper surface of the hot plate 21 (that is, the upper surface of the outer case 23) is uniformly heated to a predetermined heating temperature. In this way, the substrate W may be heated uniformly from below.

As shown in FIG. 2, the hot plate 21 is horizontally supported by a support shaft 26 extending downward from the central part of the hot plate 21. The hot plate 21 may move vertically with respect to the spin base 16. The hot plate 21 is connected to a plate lifting unit 27 via the support shaft 26. The plate lifting unit 27 vertically lifts and lowers the hot plate 21 between an upper position (position shown in FIG. 7C) and a lower position (position shown in FIG. 2).

As shown in FIG. 2, the plurality of nozzles include a chemical liquid nozzle 31 which discharges a chemical liquid toward the upper surface of the substrate W, a rinse liquid nozzle 32 which discharges a rinse liquid toward the upper surface of the substrate W, and an upper surface nozzle 33 which selectively discharges a first liquid, a second liquid, and a gas toward the upper surface of the substrate W.

The chemical liquid nozzle 31 may be a scan nozzle capable of moving horizontally in the chamber 4, or may be a fixed nozzle fixed to the partition wall 11 of the chamber 4. The same applies to the rinse liquid nozzle 32 and the upper surface nozzle 33. In FIG. 2, the chemical liquid nozzle 31, the rinse liquid nozzle 32, and the upper surface nozzle 33 are scan nozzles, and an example in which three nozzle moving units respectively corresponding to these three nozzles are provided is shown.

The chemical liquid nozzle 31 is connected to a chemical liquid pipe 34 which guides the chemical liquid to the chemical liquid nozzle 31. When a chemical liquid valve 35 provided in the chemical liquid pipe 34 is opened, the chemical liquid is continuously discharged downward from the discharge port of the chemical liquid nozzle 31. The chemical liquid discharged from the chemical liquid nozzle 31 may be a liquid containing at least one of sulfuric acid, nitric acid, hydrochloric acid, hydrofluoric acid, phosphoric acid, acetic acid, ammonia water, hydrogen peroxide water, organic acid (such as citric acid, oxalic acid and the like), organic alkali (such as tetramethylammonium hydroxide (TMAH) and the like), a surfactant and a corrosion inhibitor, or may be a liquid other than these.

Though not shown, the chemical liquid valve 35 includes a valve body provided with an annular valve seat through which the chemical liquid passes, a valve element movable with respect to the valve seat, and an actuator which moves the valve element between a closed position where the valve element contacts the valve seat and an open position where the valve element separates from the valve seat. The same applies to other valves. The actuator may be a pneumatic actuator or an electric actuator, or may be an actuator other than these. The control device 3 opens and closes the chemical liquid valve 35 by controlling the actuator.

The chemical liquid nozzle 31 is combined to a nozzle moving unit 36 which moves the chemical liquid nozzle 31 in at least one of the vertical direction and the horizontal direction. The nozzle moving unit 36 moves the chemical liquid nozzle 31 horizontally between a processing position where the chemical liquid discharged from the chemical liquid nozzle 31 is supplied to the upper surface of the substrate W and a standby position where the chemical liquid nozzle 31 is located around the processing cup 7 in a plan view. The nozzle moving unit 36 includes a ball screw, a motor and the like. The same applies to other nozzle moving units.

The rinse liquid nozzle 32 is connected to a rinse liquid pipe 37 which guides the rinse liquid to the rinse liquid nozzle 32. When a rinse liquid valve 38 provided in the rinse liquid pipe 37 is opened, the rinse liquid is continuously discharged downward from the discharge port of the rinse liquid nozzle 32. The rinse liquid discharged from the rinse liquid nozzle 32 is, for example, pure water (deionized water (DIW)). The rinse liquid may be any one of carbonated water, electrolytic ion water, hydrogen water, ozone water, hydrochloric acid water having a diluted concentration (for example, about 1 to 100 ppm), and ammonia water having a diluted concentration (for example, about 1 to 100 ppm).

The rinse liquid nozzle 32 is combined to a nozzle moving unit 39 which moves the rinse liquid nozzle 32 in at least one of the vertical direction and the horizontal direction. The nozzle moving unit 39 moves the rinse liquid nozzle 32 horizontally between a processing position where the rinse liquid discharged from the rinse liquid nozzle 32 is supplied to the upper surface of the substrate W and a standby position where the rinse liquid nozzle 32 is located around the processing cup 7 in a plan view.

The upper surface nozzle 33 includes a cylindrical nozzle body 43 having a flange part 43a at the lower end, and three fluid nozzles extending vertically inside the nozzle body 43 along the rotation axis A1. The three fluid nozzles include a first liquid nozzle 40, a second liquid nozzle 41, and a gas nozzle 42. That is, the upper surface nozzle 33 has both a function as a liquid nozzle for discharging a liquid and a function as a gas nozzle for discharging a gas.

The first liquid nozzle 40 is connected to a first liquid pipe 44 which guides the first liquid to the first liquid nozzle 40. When a first liquid valve 45 provided in the first liquid pipe 44 is opened, the first liquid is continuously discharged downward from a discharge port 40a of the first liquid nozzle 40. The first liquid nozzle 40, the first liquid pipe 44, and the first liquid valve 45 form a first liquid supply unit for supplying the first liquid to the upper surface of the substrate W held by the spin chuck 5.

The second liquid nozzle 41 is connected to a second liquid pipe 46 which guides the second liquid to the second liquid nozzle 41. When a second liquid valve 47 provided in the second liquid pipe 46 is opened, the second liquid is continuously discharged downward from a discharge port 41a the second liquid nozzle 41. The second liquid nozzle 41, the second liquid pipe 46, and the second liquid valve 47 form a second liquid supply unit for supplying the second liquid to the upper surface of the substrate W held by the spin chuck 5.

The vapor pressure of the second liquid is higher than the vapor pressure of the first liquid. The surface tension of the second liquid is lower than the surface tension of the first liquid. The specific gravity of the second liquid is larger than the specific gravity of the first liquid. The surface tension of the first liquid may be lower than the surface tension of water. The boiling point of the second liquid may be lower than the boiling point of water. Similarly, the boiling point of the first liquid may be lower than the boiling point of water.

Hereinafter, an example is described in which the first liquid is an IPA (vapor pressure at atmospheric pressure and at room temperature: 4.4 KPa; surface tension at room temperature: 0.021 N/m; specific gravity: 0.79) liquid (also simply referred to as IPA), and the second liquid is an HFE liquid.

For example, HFE of the Novec (product name; registered trademark) series manufactured by Sumitomo 3M Limited may be used as the HFE. Specifically, for the HFE, for example, Novec 7100/7100DL (chemical formula: $C_4F_9OCH_3$), Novec 7200 (chemical formula: $C_4F_9OC_2H_5$), Novec 7300 (chemical formula: $C_6F_{13}OCH_3$), HFE71IPA (hydrofluoroether azeotrope-like mixture), Novec (registered trademark) 7000 and the like may be exemplified. All of the exemplified HFEs have a vapor pressure higher than that of the IPA and a surface tension lower than that of the IPA. The specific gravity of all of the exemplified HFEs is higher than that of the IPA or water.

The gas nozzle 42 is connected to a gas pipe 48 which guides the gas to the gas nozzle 42. When a gas valve 49 provided in the gas pipe 48 is opened, the gas is continuously discharged downward from a discharge port 42a of the gas nozzle 42 at a flow rate corresponding to the opening degree of a flow rate adjusting valve 50 which changes the flow rate of the gas. The gas discharged from the gas nozzle 42 is an inert gas such as nitrogen gas. The inert gas may be a gas other than nitrogen gas such as helium gas or argon gas. The gas nozzle 42, the gas pipe 48, the gas valve 49, and the flow rate adjusting valve 50 form a gas blowing unit for blowing a gas to the upper surface of the substrate W held by the spin chuck 5.

The upper surface nozzle 33 is combined to a nozzle moving unit 51 which moves the upper surface nozzle 33 in at least one of the vertical direction and the horizontal direction. The nozzle moving unit 51 moves the upper surface nozzle 33 horizontally between a processing position where the fluid (the first liquid, the second liquid, or the gas) discharged from the three nozzles included in the upper surface nozzle 33 is supplied to the upper surface of the substrate W and a standby position where the upper surface nozzle 33 is located around the processing cup 7 in a plan view. The movement of the upper surface nozzle 33 by the nozzle moving unit 51 causes the first liquid nozzle 40, the second liquid nozzle 41, and the gas nozzle 42 to move integrally.

An annular gas discharge port 96 opens outward on the outer peripheral surface of the flange part 43a.

A plurality of gas discharge ports 96 may be provided on the outer peripheral surface of the flange part 43a at intervals in the vertical direction.

The gas discharge port 96 is connected to a gas pipe 97 which guides the gas to the gas discharge port 96. When a gas valve 98 provided in the gas pipe 97 is opened, the gas is continuously discharged outward from the gas discharge port 96. The gas discharged from the gas discharge port 96 is an inert gas such as nitrogen gas. The inert gas may be a gas other than nitrogen gas such as helium gas or argon gas.

The processing cup 7 includes a plurality of guards 54 which receive the processing liquid removed outward from the substrate W, a plurality of cups 53 which receive the processing liquid guided downward by the plurality of guards 54, and a cylindrical outer wall member 52 which surrounds the plurality of guards 54 and the plurality of cups 53. FIG. 2 shows an example in which four guards 54 and three cups 53 are provided, and the outermost cup 53 is integrated with the third guard 54 from the top.

The guard 54 includes a cylindrical part 55 which surrounds the spin chuck 5, and an annular ceiling part 56 which extends obliquely upward from the upper end part of the cylindrical part 55 toward the rotation axis A1. The plurality of ceiling parts 56 are vertically overlapped with each other, and the plurality of cylindrical parts 55 are concentrically disposed. The annular upper end of the ceiling part 56 corresponds to an upper end 54u of the guard 54 which surrounds the substrate W and the spin base 16 in a plan view. The plurality of cups 53 are respectively disposed below the plurality of cylindrical parts 55. The cup 53 forms a ring-shaped liquid receiving groove which receives the processing liquid guided downward by the guard 54.

The processing unit 2 includes a guard lifting unit 57 which individually lifts and lowers the plurality of guards 54. The guard lifting unit 57 positions the guard 54 at any position from the upper position to the lower position. FIG. 2 shows a state where two of the guards 54 are disposed at the upper position and the other two guards 54 are disposed at the lower position. The upper position is a position where the upper end 54u of the guard 54 is disposed above a holding position where the substrate W held by the spin chuck 5 is disposed. The lower position is a position where the upper end 54u of the guard 54 is disposed below the holding position.

When the processing liquid is supplied to the substrate W that is rotating, at least one of the guards 54 is disposed at the upper position. When the processing liquid is supplied to the substrate W in this state, the processing liquid is shaken off from the substrate W to the outside. The shaken-off processing liquid collides with the inner surface of the guard 54 horizontally facing the substrate W and is guided to the cup 53 corresponding to the guard 54. In this way, the processing liquid removed from the substrate W is collected in the cup 53.

Figure 4:
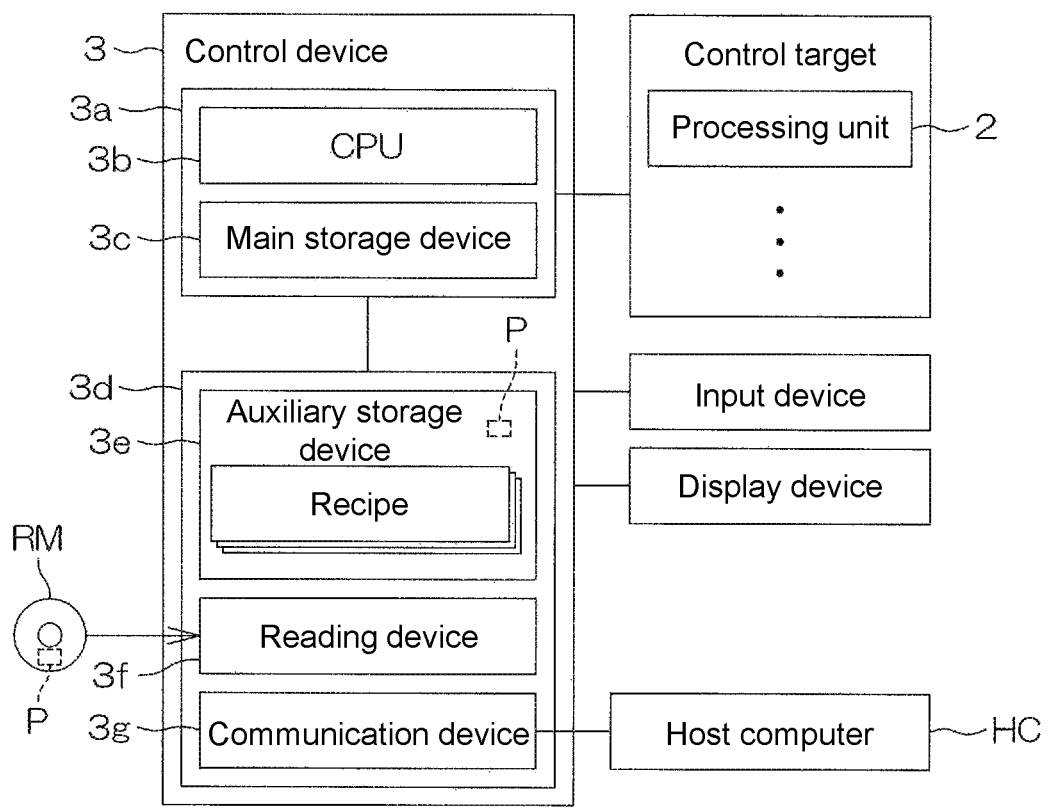
FIG. 4 is a block diagram showing hardware of the control device shown in FIG. 1A.

FIG. 4 is a block diagram showing hardware of the control device 3.

The control device 3 is a computer including a computer body 3a and a peripheral device 3d connected to the computer body 3a. The computer body 3a includes a CPU 3b (central processing unit) which executes various instructions, and a main storage device 3c which stores information. The peripheral device 3d includes an auxiliary storage device 3e which stores information such as a program P, a reading device 3f which reads information from removable media RM, and a communication device 3g which communicates with other devices such as a host computer HC.

The control device 3 is connected to an input device and a display device. The input device is operated when an operator such as a user or a maintenance person inputs information to the substrate processing device 1. The information is displayed on the screen of the display device. The input device may be any one of a keyboard, a pointing device, and a touch panel, or may be a device other than these. The substrate processing device 1 may be provided with a touch panel display which serves as the input device as well as the display device.

The CPU 3b executes the program P stored in the auxiliary storage device 3e. The program P in the auxiliary storage device 3e may be installed in the control device 3 in advance, or may be sent from the removable media RM to the auxiliary storage device 3e through the reading device 3f, or may be sent from an external device such as the host computer HC to the auxiliary storage device 3e through the communication device 3g.

The auxiliary storage device 3e and the removable media RM are non-volatile memories which retain storage even when power is not supplied. The auxiliary storage device 3e is, for example, a magnetic storage device such as a hard disk drive. The removable media RM is, for example, an optical disk such as a compact disk or a semiconductor memory such as a memory card. The removable media RM is an example of a computer-readable recording medium in which the program P is recorded. The removable media RM is a non-temporary tangible recording medium.

The auxiliary storage device 3e stores a plurality of recipes. The recipe is information which defines processing contents, processing conditions, and processing procedures of the substrate W. A plurality of recipes differ from each other in at least one of the processing contents, the processing conditions, and the processing procedures of the substrate W. The control device 3 controls the substrate processing device 1 so that the substrate W is processed according to the recipe designated by the host computer HC. The control device 3 is programmed to execute the substrate processing example described below.

Hereinafter, a case of processing the substrate W which has a pattern formed on a surface Wa will be described.

Figure 5:
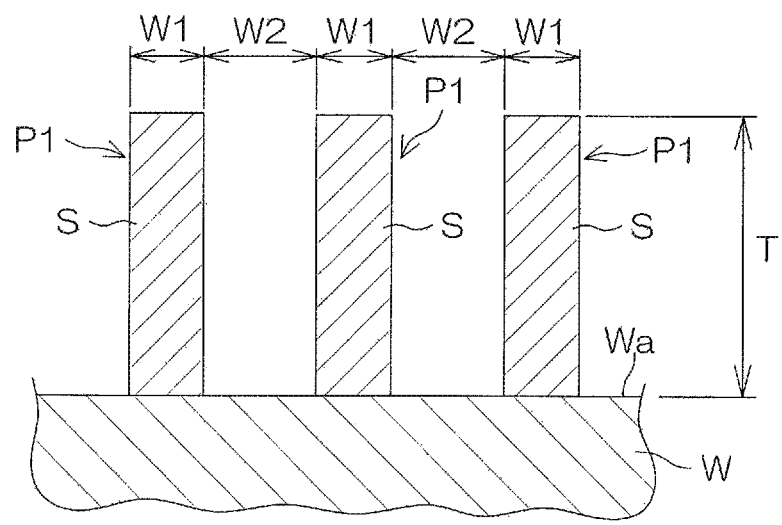
FIG. 5 is an enlarged cross-sectional view showing the surface of the substrate to be processed by the substrate processing device.

FIG. 5 is an enlarged cross-sectional view showing the surface Wa of the substrate W to be processed by the substrate processing device 1. The substrate W to be processed is, for example, a silicon wafer, and the surface Wa of the substrate W corresponds to a device formation surface on which devices such as transistors and capacitors are formed. A pattern P1 is formed on the surface Wa of the substrate W which is the pattern formation surface. The pattern P1 is, for example, a fine pattern. As shown in FIG. 5, the pattern P1 may be a pattern in which structures S having a convex shape are disposed in a matrix. In this case, a line width W1 of the structure S is set to, for example, about 1 nm to 45 nm, and a gap W2 of the pattern P1 is set to, for example, about 1 nm to several μm. The height (film thickness) of the pattern P1 is, for example, about 10 nm to 1 μm. Further, the pattern P1 may have an aspect ratio (ratio of a height T to the line width W1) of, for example, about 5 to 100 (typically about 5 to 30). Further, the pattern P1 may be a pattern in which line-shaped patterns formed by fine trenches are repeatedly disposed. Further, the pattern P1 may be formed by providing a plurality of fine holes (voids or pores) in the thin film.

Next, a substrate processing example will be described.

Figure 6:
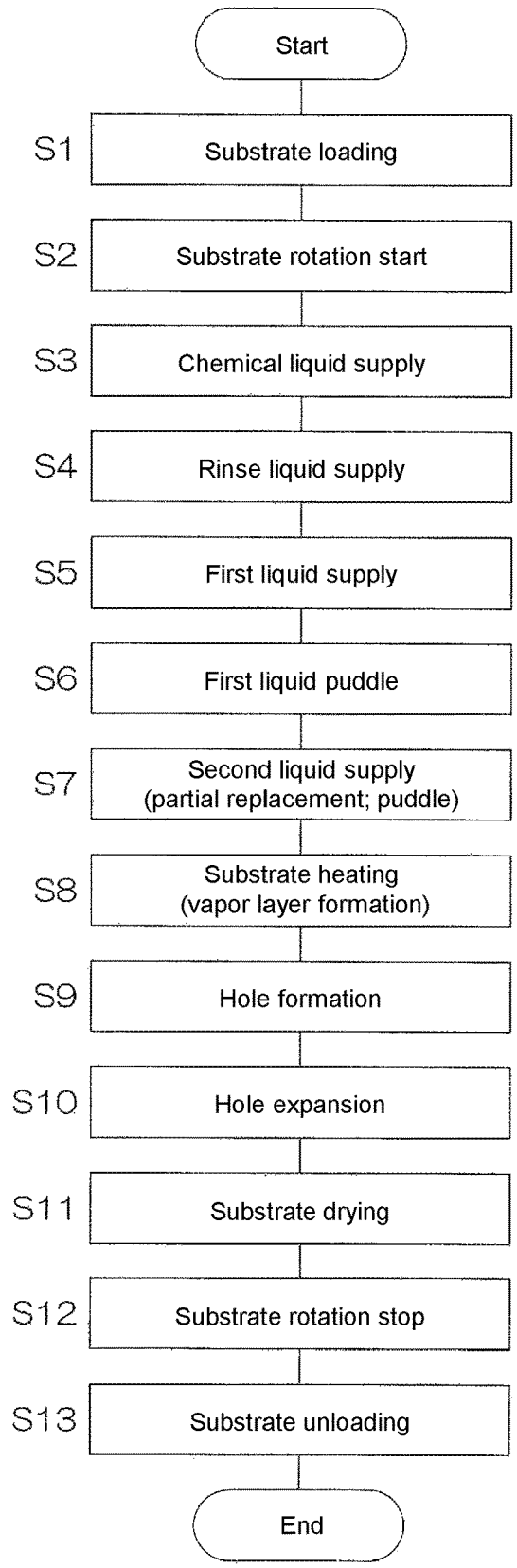
FIG. 6 is a flowchart for illustrating a substrate processing example performed by the substrate processing device.

FIG. 6 is a process diagram for illustrating a substrate processing example of the substrate W performed by the substrate processing device 1. FIGS. 7A to 7F are schematic views showing the state of the substrate W when the substrate processing example is performed. FIGS. 8A to 8D are schematic views of the substrate W in each state as viewed from above. In the following, please refer to FIGS. 2 to 6. Please refer to FIGS. 7A to 7F and FIGS. 8A to 8D as appropriate.

The substrate W to be processed is, for example, a semiconductor wafer such as a silicon wafer.

When the substrate W is processed by the substrate processing device 1, a substrate loading step (S1 in FIG. 6) of loading the substrate W into the chamber 4 is performed.

Specifically, in a state where all the guards 54 are located at the lower position and all the scan nozzles are located at the standby position, the center robot CR (see FIG. 1A) moves the hand H1 into the chamber 4 while supporting the substrate W with the hand H1. Then, the center robot CR places the substrate W on the hand H1 onto the plurality of chuck pins 17 with the surface Wa of the substrate W facing upward. Thereafter, the plurality of chuck pins 17 are pressed against the outer peripheral surface of the substrate W by the driving of the chuck pin driving unit 20, and the substrate W is gripped by the plurality of chuck pins 17. After placing the substrate W on the spin chuck 5, the center robot CR retracts the hand H1 from the inside of the chamber 4.

Next, the control device 3 controls the spin motor 19 to start the rotation of the substrate W (S2 in FIG. 6). In this way, the substrate W rotates at a chemical liquid supply speed (greater than or equal to 100 rpm and less than 1000 rpm).

Next, a chemical liquid supply step (S3 in FIG. 6) of supplying the chemical liquid to the upper surface of the substrate W to form a liquid film of the chemical liquid covering the entire upper surface of the substrate W is performed.

Specifically, the control device 3 controls the nozzle moving unit 36 to move the chemical liquid nozzle 31 from the standby position to the processing position. Thereafter, the control device 3 opens the chemical liquid valve 35 and starts the discharge of the chemical liquid from the chemical liquid nozzle 31. When a predetermined time has elapsed since the chemical liquid valve 35 is opened, the control device 3 closes the chemical liquid valve 35. In this way, the discharge of the chemical liquid from the chemical liquid nozzle 31 is stopped. Then, the nozzle moving unit 36 moves the chemical liquid nozzle 31 to the standby position.

The chemical liquid discharged from the chemical liquid nozzle 31 collides with the upper surface of the substrate W which is rotating at the chemical liquid supply speed, and then flows outward along the upper surface of the substrate W by a centrifugal force. Therefore, the chemical liquid is supplied to the entire upper surface of the substrate W, and the liquid film of the chemical liquid covering the entire upper surface of the substrate W is formed. When the chemical liquid nozzle 31 is discharging the chemical liquid, the control device 3 controls the nozzle moving unit 36, whereby the liquid landing position may be moved so that the liquid landing position of the chemical liquid with respect to the upper surface of the substrate W passes through the central part and the outer peripheral part of the upper surface of the substrate W, or the liquid landing position may be stationary at the central part of the upper surface of the substrate W.

Next, a rinse liquid supply step (S4 in FIG. 6) of supplying the rinse liquid to the upper surface of the substrate W to wash away the chemical liquid on the substrate W is performed.

Specifically, with at least one guard 54 located at the upper position, the control device 3 controls the nozzle moving unit 39 to move the rinse liquid nozzle 32 from the standby position to the processing position. Thereafter, the control device 3 opens the rinse liquid valve 38 and starts the discharge of the rinse liquid (for example, pure water) from the rinse liquid nozzle 32. Before the discharge of the rinse liquid is started, in order to switch the guard 54 that receives the liquid removed from the substrate W, the control device 3 may control the guard lifting unit 57 to move at least one guard 54 vertically. When a predetermined time has elapsed since the rinse liquid valve 38 is opened, the control device 3 closes the rinse liquid valve 38 and stops the discharge of the rinse liquid from the rinse liquid nozzle 32. Thereafter, the control device 3 controls the nozzle moving unit 39 to move the rinse liquid nozzle 32 to the standby position.

The rinse liquid discharged from the rinse liquid nozzle 32 collides with the upper surface of the substrate W which is rotating at a rinse liquid supply speed (greater than or equal to 100 rpm and less than 1000 rpm), and then flows outward along the upper surface of the substrate W by a centrifugal force. The chemical liquid on the substrate W is replaced with the rinse liquid discharged from the rinse liquid nozzle 32. In this way, a liquid film of the rinse liquid covering the entire upper surface of the substrate W is formed. When the rinse liquid nozzle 32 is discharging the rinse liquid, the control device 3 controls the nozzle moving unit 39, whereby the liquid landing position may be moved so that the liquid landing position of the rinse liquid with respect to the upper surface of the substrate W passes through the central part and the outer peripheral part of the upper surface of the substrate W, or the liquid landing position may be stationary at the central part of the upper surface of the substrate W.

Next, in order to replace the rinse liquid on the upper surface of the substrate W with the first liquid, a first liquid supply step (S5 in FIG. 6) of supplying the first liquid to the upper surface of the substrate W is performed.

Specifically, with at least one guard 54 located at the upper position, the control device 3 controls the spin chuck 5 to rotate the substrate W at a replacement speed. The replacement speed may be equal to or different from the rinse liquid supply speed. With the upper surface nozzle 33 disposed at the processing position, the control device 3 opens the first liquid valve 45 and starts the discharge of the first liquid from the first liquid nozzle 40. Before the discharge of the first liquid is started, in order to switch the guard 54 that receives the liquid removed from the substrate W, the control device 3 may control the guard lifting unit 57 to move at least one guard 54 vertically.

The first liquid discharged from the first liquid nozzle 40 collides with the upper surface of the substrate W which is rotating at the replacement speed, and then flows outward along the upper surface of the substrate W. The rinse liquid on the substrate W is replaced with the first liquid discharged from the first liquid nozzle 40. In this way, a first liquid film F1 (a liquid film of the first liquid; the same applies below) covering the entire upper surface of the substrate W is formed. Then, the rinse liquid among the pattern P1 on the substrate W is replaced with the first liquid. In this example, the first liquid is supplied to the upper surface nozzle 33 in a state where the first liquid discharged from the first liquid nozzle 40 is stationary at a central processing position where it collides with the central part of the upper surface of the substrate W. However, the nozzle moving unit 51 may be controlled to move the liquid landing position so that the liquid landing position of the first liquid with respect to the upper surface of the substrate W passes through the central part and the outer peripheral part of the upper surface of the substrate W.

After the liquid film of the rinse liquid is replaced with the first liquid film F1, a first liquid puddle step (S6 in FIG. 6) of holding the first liquid film F1 on the upper surface of the substrate W while stopping the discharge of the first liquid is performed.

Specifically, with the first liquid nozzle 40 being stationary at the central processing position, the control device 3 controls the spin motor 19 to reduce the rotation speed of the substrate W from the replacement speed to a first puddle speed. The first puddle speed is, for example, a speed greater than 0 and less than or equal to 50 rpm. The deceleration from the replacement speed to the first puddle speed is performed gradually. After the rotation speed of the substrate W decreases to the first puddle speed, the control device 3 closes the first liquid valve 45 and stops the discharge of the first liquid.

When the rotation speed of the substrate W decreases to the first puddle speed, the centrifugal force applied to the first liquid on the substrate W weakens. Therefore, the first liquid is not removed from the upper surface of the substrate W, or only a trace amount thereof is removed. Therefore, even after the discharge of the first liquid is stopped, the first liquid film F1 covering the entire upper surface of the substrate W is held on the substrate W. Even if a small amount of rinse liquid remains among the pattern P1 (see FIG. 5) after the liquid film of the rinse liquid is replaced with the first liquid film F1, the rinse liquid dissolves in the first liquid and diffuses in first liquid. In this way, the rinse liquid remaining among the pattern P1 may be reduced.

Next, in order to replace only a part of the first liquid on the upper surface of the substrate W with the second liquid (that is, partially replace), a second liquid supply step (S7 in FIG. 6) of supplying the second liquid to the upper surface of the substrate W is performed.

Specifically, with at least one guard 54 located at the upper position, the control device 3 controls the spin motor 19 to rotate the substrate W at a second puddle speed. The second puddle speed is, for example, a speed greater than 0 and less than or equal to 10 rpm. The second puddle speed may be equal to or different from the first puddle speed. The second puddle speed may be 0 rpm. That is, the rotation of the substrate W may be stopped in the second liquid supply step (S7).

Figure 7A:
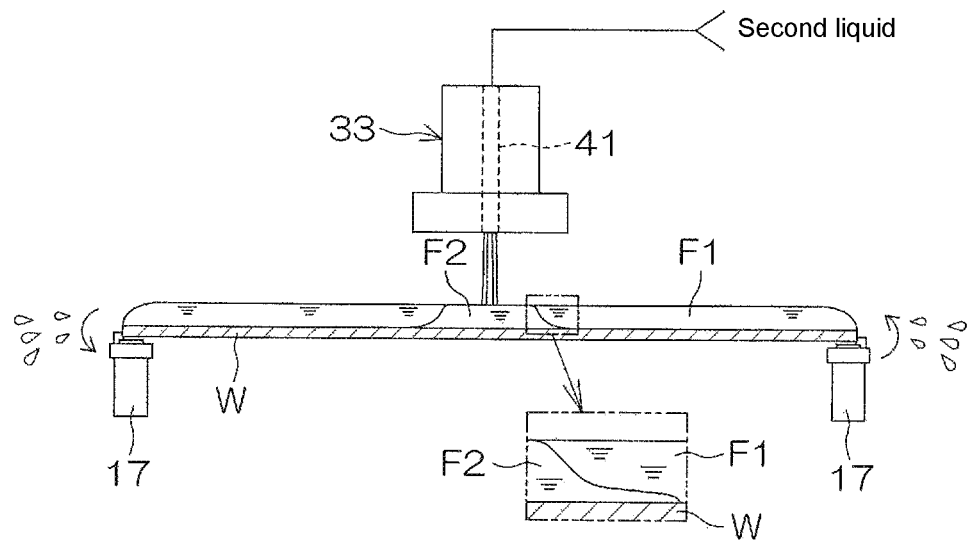
FIG. 7A is a schematic view showing the state of the substrate when the substrate processing example is performed.

The control device 3 opens the second liquid valve 47 and starts discharging the second liquid from the second liquid nozzle 41, as shown in FIG. 7A. Before the discharge of the second liquid is started, in order to switch the guard 54 that receives the liquid removed from the substrate W, the control device 3 may control the guard lifting unit 57 to move at least one guard 54 vertically.

The second liquid discharged from the second liquid nozzle 41 collides with the first liquid film F1 at the central part of the upper surface of the substrate W. The second liquid penetrates the first liquid film F1 and collides with the central part of the upper surface of the substrate W. The supply of the second liquid causes the first liquid on the central part of the upper surface of the substrate W to be washed away outward along the upper surface of the substrate W. The second liquid that has collided with the central part of the upper surface of the substrate W flows outward from the central part of the upper surface of the substrate W in all directions along the upper surface of the substrate W. In this way, as shown in FIG. 7A, a second liquid film F2 (a liquid film of the second liquid; the same applies below) in a substantially circular shape formed on the central part of the upper surface of the substrate W and the first liquid film F1 in a ring shape surrounding the side of the second liquid film F2 are formed on the upper surface of the substrate W.

The specific gravity of the second liquid is larger than the specific gravity of the first liquid. Therefore, at the interface between the first liquid and the second liquid, the second liquid moves toward the upper surface side of the substrate W by gravity, and the first liquid moves above the second liquid. That is, the second liquid enters between the first liquid and the substrate W due to the difference in specific gravity (see FIG. 7A). In this way, in the region where the second liquid film F2 is formed on the upper surface of the substrate W, the first liquid among the pattern P1 is replaced with the second liquid having a lower surface tension.

When the second liquid nozzle 41 is discharging the second liquid, the second liquid nozzle 41 is stationary at a central processing position (the position shown in FIG. 7A) where the second liquid discharged from the second liquid nozzle 41 collides with the central part of the upper surface of the substrate W. When the discharge of the second liquid is continued, the outer diameter of the second liquid film F2 gradually increases, and the width of the first liquid film F1 in a ring shape gradually decreases.

As described above, at the interface between the first liquid and the second liquid, the second liquid enters between the first liquid and the substrate W due to the difference in specific gravity, but when the discharge of the second liquid is continued, such an interface moves outward along the upper surface of the substrate W. Therefore, the liquid deep inside the grooves among the pattern P1 (see FIG. 5) may also be replaced with the second liquid. In this way, the first liquid remaining between the second liquid and the substrate W may be reduced, and the first liquid may be reliably replaced with the second liquid having a lower surface tension.

Figure 7B:
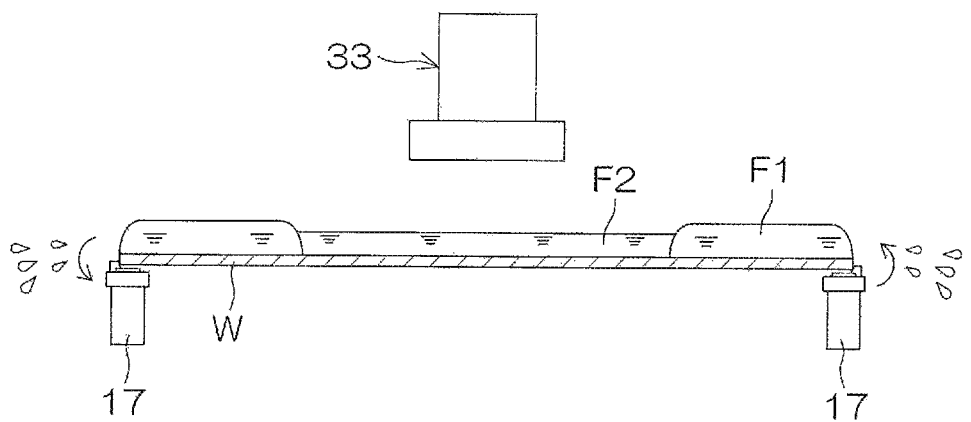
FIG. 7B is a schematic view showing the next state of FIG. 7A.
Figure 8A:
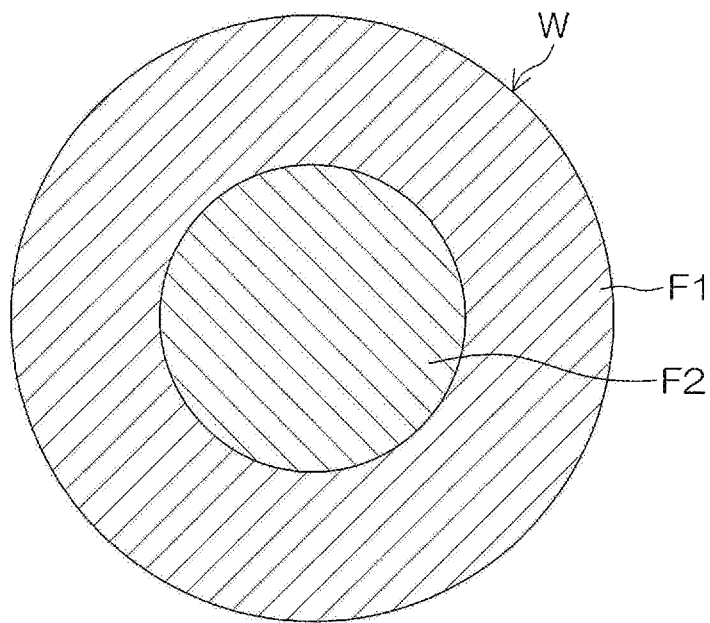
FIG. 8A is a schematic view of the substrate in the state shown in FIG. 7B as viewed from above.

As shown in FIGS. 7B and 8A, the second liquid valve 47 is closed before all the first liquid film F1 disappears from the upper surface of the substrate W. Since the rotation speed of the substrate W is the second puddle speed (for example, a speed of greater than 0 and less than or equal to 10 rpm, or 0 rpm (the rotation stops)), the remaining first liquid is not removed from the upper surface of the substrate W, or only a trace amount is removed. Therefore, with the discharge of the second liquid stopped, as shown in FIG. 8A, the second liquid film F2 in a substantially circular shape covering the central part of the upper surface of the substrate W and the first liquid film F1 in a ring shape surrounding the side of the second liquid film F2 are formed on the upper surface of the substrate W, and the first liquid film F1 and the second liquid film F2 are held on the upper surface of the substrate W (liquid film formation step).

The first liquid film F1 and the second liquid film F2 shown in FIG. 8A will be described.

The surface tension of the first liquid included in the first liquid film F1 surrounding the side of the second liquid film F2 is higher than that of the second liquid. Further, the side of the second liquid film F2 is surrounded by the first liquid film F1, whereby the outflow of the second liquid from the substrate W is blocked by the first liquid film F1. In the entire liquid film including the first liquid film F1 and the second liquid film F2, the shape of the liquid film is kept by the surface tension of the liquid included in the outer peripheral part thereof. Since the outer peripheral part of the entire liquid film is formed by the first liquid having a high surface tension, the shape of the liquid film may be kept for the entire liquid film including the first liquid film F1 and the second liquid film F2.

Figure 8B:
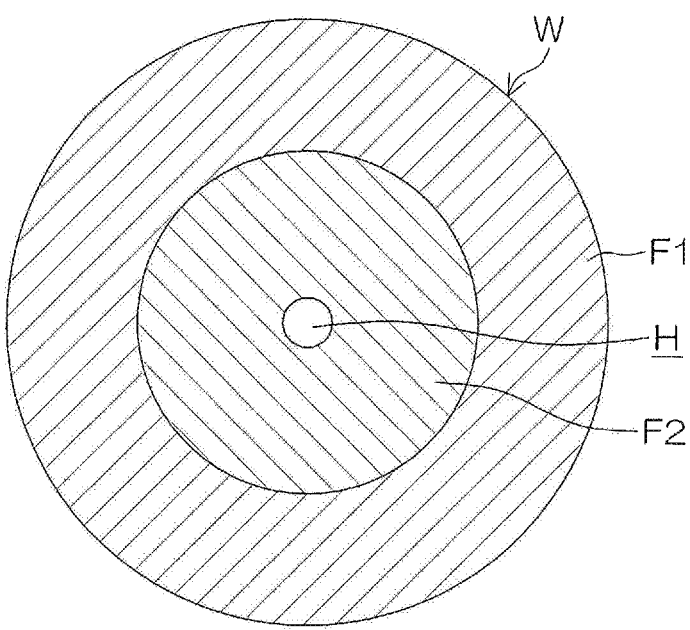
FIG. 8B is a schematic view of the substrate in the state shown in FIG. 7D as viewed from above.
Figure 8C:
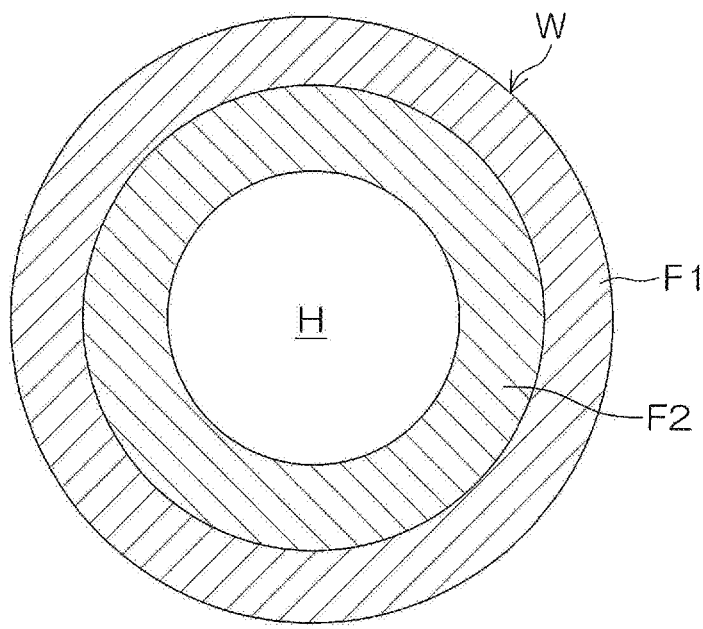
FIG. 8C is a schematic view of the substrate in the state shown in FIG. 7E as viewed from above.
Figure 8D:
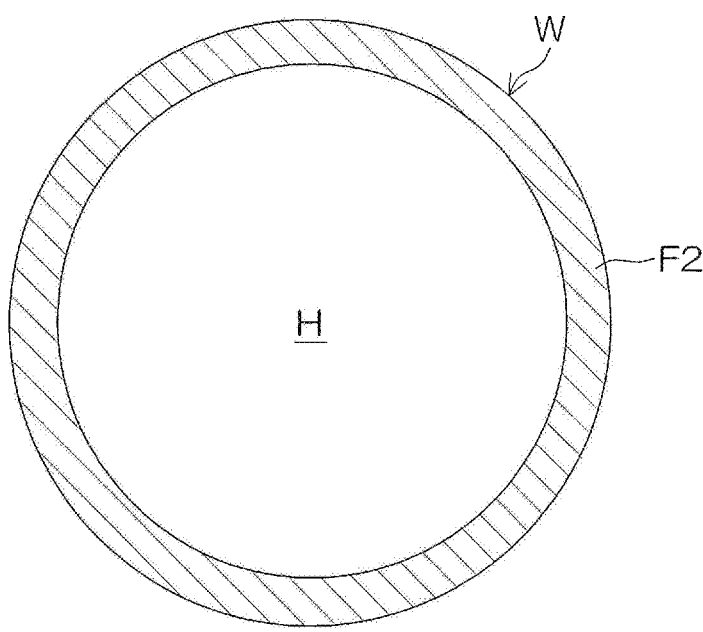
FIG. 8D is a schematic view of the substrate in the state shown in FIG. 7F as viewed from above.

When the amount of the second liquid existing on the upper surface of the substrate W becomes too small, the second liquid film F2 may not maintain a ring shape when the inner diameter of the second liquid film F2 spreads near the outer diameter of the substrate W (see FIG. 8D). On the other hand, when the amount of the second liquid existing on the upper surface of the substrate W becomes too large, the amount of the first liquid existing on the upper surface of the substrate W becomes too small, and the first liquid film F1 may not support the second liquid film F2 when the second liquid film F2 and the first liquid film F1 are held on the upper surface of the substrate W (see FIG. 8A). Therefore, the size of the second liquid film F2 held on the upper surface of the substrate W is set so that the second liquid film F2 may maintain a ring shape when the inner diameter of the second liquid film F2 spreads near the outer diameter of the substrate W (see FIG. 8D), and the first liquid film F1 may support the second liquid film F2 when the second liquid film F2 and the first liquid film F1 are held on the upper surface of the substrate W (see FIG. 8A). In this example, as shown in FIG. 8A, the width of the first liquid film F1 is set to be about the same as the radius of the second liquid film F2. The ratio of the width of the first liquid film F1 to the radius of the second liquid film F2 is preferably 1:2 to 2:1.

After the first liquid film F1 and the second liquid film F2 are formed on the upper surface of the substrate W, the substrate W is heated by the hot plate 21, whereby a vapor layer formation step (S8 in FIG. 6) of forming a first vapor layer L1 between the first liquid and the upper surface of the substrate W and forming a second vapor layer L2 between the second liquid and the upper surface of the substrate W is performed. In the vapor layer formation step (S8), the first liquid film F1 is mainly held on the first vapor layer L1, and the second liquid film F2 is mainly held on the second vapor layer L2.

Specifically, in a case where the substrate W is rotating at the second puddle speed (the value of the second puddle speed is greater than 0), the control device 3 stops the rotation of the substrate W with at least one guard 54 located at the upper position. In a case where the substrate W is not rotating (the second puddle speed is 0 rpm), the control device 3 maintains the state where the substrate W is not rotating with at least one guard 54 located at the upper position. Then, the control device 3 controls the chuck pin driving unit 20 to release the grip of the substrate W. After the grip is released, the substrate W is supported from below by the plurality of chuck pins 17.

Further, the control device 3 starts the supply of power to the hot plate 21 to cause the entire or substantially entire upper surface of the hot plate 21 to generate heat, whereby the upper surface of the hot plate 21 is heated to a predetermined heating temperature. In this way, the substrate W may be heated uniformly. The heating temperature is equal to or greater than the boiling point of the second liquid. Further, the heating temperature is equal to or greater than the boiling point of the first liquid.

Figure 7C:
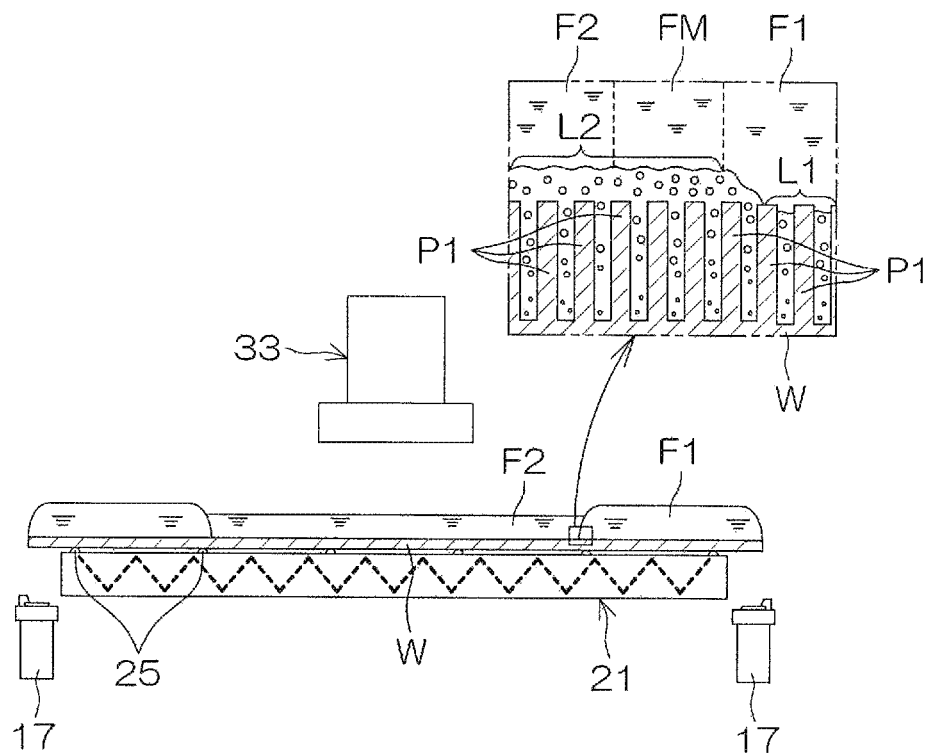
FIG. 7C is a schematic view showing the next state of FIG. 7B.

Then, the control device 3 controls the plate lifting unit 27 to lift the hot plate 21 which has been located at the lower position up to the upper position. During the process in which the hot plate 21 is lifted toward the upper position, the plurality of protruding parts 25 of the hot plate 21 come into contact with the lower surface of the substrate W. By further lifting the hot plate 21, the substrate W lifted by the hot plate 21 is separated upward from the plurality of chuck pins 17, as shown in FIG. 7C. In this way, the substrate W is transferred from the plurality of chuck pins 17 to the hot plate 21, and the hot plate 21 supports the substrate W. In this state, since the hot plate 21 is in contact with the lower surface of the substrate W, the substrate W is heated by the hot plate 21 while being stationary on the hot plate 21.

The heat generation of the hot plate 21 may be started before the start of the vapor layer formation step (S8). Specifically, the heat generation of the hot plate 21 may be started before or after the second liquid is supplied to the substrate W, or may be started at the same time as the second liquid is supplied to the substrate W.

Since the temperature of the surface Wa of the substrate W (that is, the temperature of the pattern P1 formed on the surface Wa) is equal to or greater than the boiling point of the second liquid, the second liquid evaporates at the interface between the second liquid film F2 and the substrate W, and many small bubbles exist between the second liquid and the upper surface of the substrate W. The second liquid evaporates throughout the interface between the second liquid film F2 and the substrate W, whereby the second vapor layer L2 (see FIG. 7C) including the vapor of the second liquid is formed between the second liquid film F2 and the substrate W. In this way, the second liquid separates from the upper surface of the substrate W, and the second liquid film F2 floats from the upper surface of the substrate W. Then, the second liquid film F2 is mainly held on the second vapor layer L2. At this time, the frictional resistance acting on the second liquid film F2 on the substrate W is so small that it may be regarded as zero.

Further, in a case where the temperature of the surface Wa of the substrate W (that is, the temperature of the pattern P1 formed on the surface Wa) is equal to or greater than the boiling point of the first liquid, the first liquid evaporates at the interface between the first liquid film F1 and the substrate W, and many small bubbles exist between the first liquid and the upper surface of the substrate W. The first liquid evaporates throughout the interface between the first liquid film F1 and the substrate W, whereby the first vapor layer L1 (see FIG. 7C) including the vapor of the first liquid is formed between the first liquid film F1 and the substrate W. In this way, the first liquid separates from the upper surface of the substrate W, and the first liquid film F1 floats from the upper surface of the substrate W. Then, the first liquid film F1 is mainly held on the first vapor layer L1. At this time, the frictional resistance acting on the first liquid film F1 on the substrate W is so small that it may be regarded as zero.

Strictly speaking, a liquid film FM of a mixed liquid of the first liquid and the second liquid is formed at the interface between the first liquid film F1 and the second liquid film F2, as shown in FIG. 7C.

Since the vapor pressure of the second liquid included in the second liquid film F2 is higher than the vapor pressure of the first liquid included in the first liquid film F1, the film thickness of the second vapor layer L2 is larger than the film thickness of the first vapor layer L1. Therefore, as shown in FIG. 7C, the lower surface of the floating second liquid film F2 is higher than the lower surface of the floating first liquid film F1. Further, since the vapor pressure of the second liquid included in the second liquid film F2 is higher than the vapor pressure of the first liquid included in the first liquid film F1, the second vapor layer L2 may overhang below a part of the first liquid film F1.

In a case where the height T of the pattern P1 (see FIG. 5) is higher than the lower surface of the floating first liquid film F1, as shown in FIG. 7C, the first liquid film F1 and the pattern P1 may come into contact. Even in this case, since the vapor pressure of the second liquid is higher than the vapor pressure of the first liquid, as shown in FIG. 7C, the lower surface of the second liquid film F2 may be disposed above the upper end of the pattern P1.

After the first liquid film F1 and the second liquid film F2 have floated, a gas blowing removal step (S9 in FIG. 6 and S10 in FIG. 6) of removing the first liquid and the second liquid outside the substrate W by the gas is performed. The gas blowing removal step includes a hole formation step (S9) of making a hole H in the second liquid film F2 by blowing the gas to the floating second liquid film F2 to partially remove the second liquid, and a hole expansion step (S10) of moving the first liquid film F1 onto the first vapor layer L1 and the second liquid film F2 onto the second vapor layer L2 to expand the hole H to the outer periphery of the upper surface of the substrate W.

Specifically, the control device 3 opens the gas valve 49 and starts the discharge of the gas from the discharge port 42a of the gas nozzle 42. The temperature of the gas discharged from the gas nozzle 42 may be room temperature or higher than room temperature. The gas discharged from the gas nozzle 42 collides with the second liquid film F2 at the central part of the upper surface of the substrate W, and then flows outward along the surface of the second liquid film F2. In this way, an air flow flowing outward from the central part of the upper surface of the substrate W is formed.

Figure 7D:
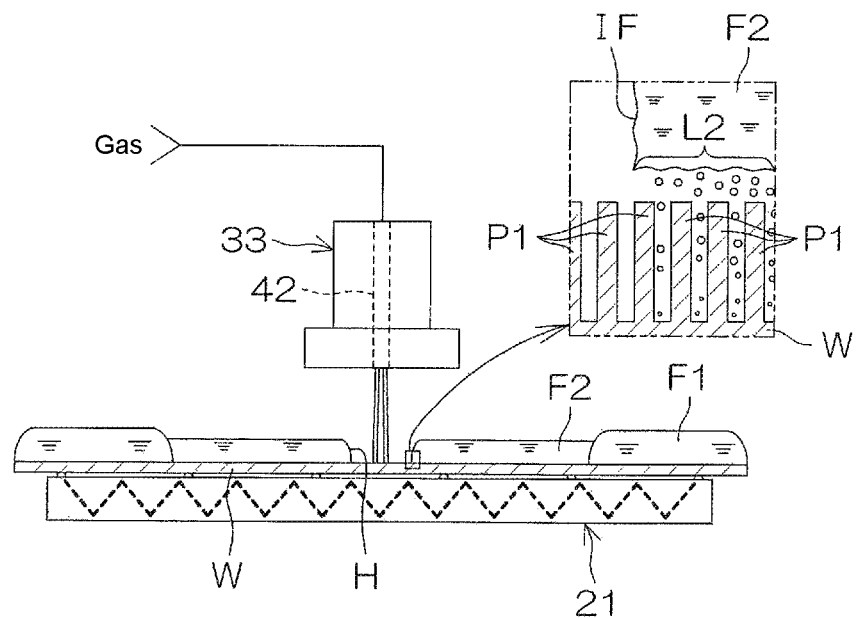
FIG. 7D is a schematic view showing the next state of FIG. 7C.

When the gas is blown to the central part of the second liquid film F2, the second liquid included in the second liquid film F2 is pushed outward by the pressure of the gas. Further, the supply of the gas facilitates the evaporation of the second liquid. In this way, the thickness of the central part of the second liquid film F2 is reduced, and as shown in FIGS. 7D and 8B, the hole H in a substantially circular shape is formed in the central part of the second liquid film F2 (hole formation step (S9)). The hole H is an exposure hole which exposes the upper surface of the substrate W. The flow rate of the gas discharged from the gas nozzle 42 for forming the hole H is, for example, 5 L/min.

Thereafter, the control device 3 increases the opening degree of the flow rate adjusting valve 50 to increase the flow rate of the gas discharged from the gas nozzle 42 to, for example, 15 L/min. In this way, the force that moves the second liquid outward is applied to the second liquid on the substrate W by the gas flowing outward along the surface of the second liquid film F2, and the second liquid flows outwards along the upper surface of the substrate W.

Figure 7E:
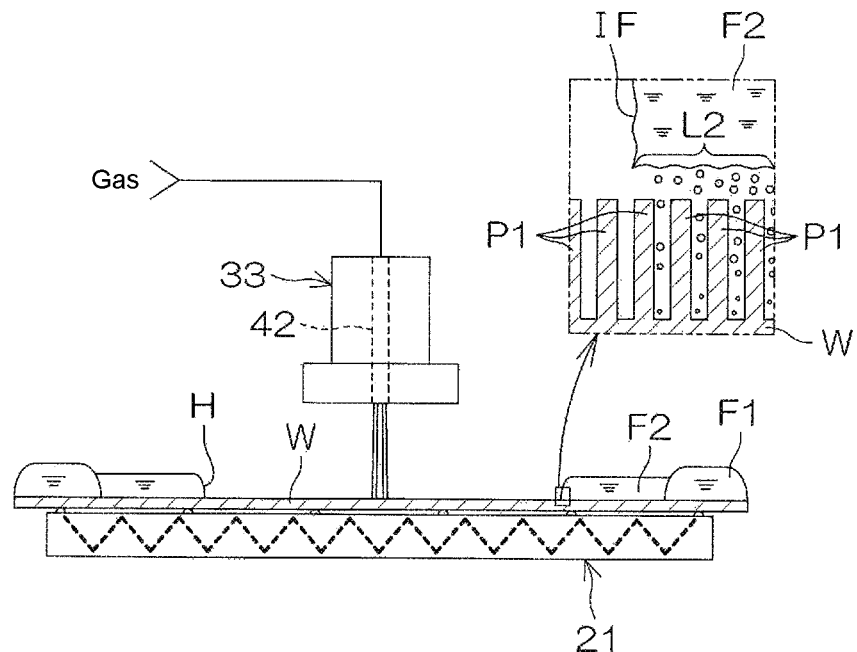
FIG. 7E is a schematic view showing the next state of FIG. 7D.

As the second liquid flows outward along the upper surface of the substrate W, the inner diameter and the outer diameter of the second liquid film F2 in a ring shape increase, as shown in FIGS. 7E and 8C. That is, the outer edge of the hole H (that is, the inner circumference of the second liquid film F2) is expanded (hole expansion step (S10)). The first liquid on the outer peripheral part of the upper surface of the substrate W is pushed outward by the second liquid and is removed from the substrate W.

Figure 7F:
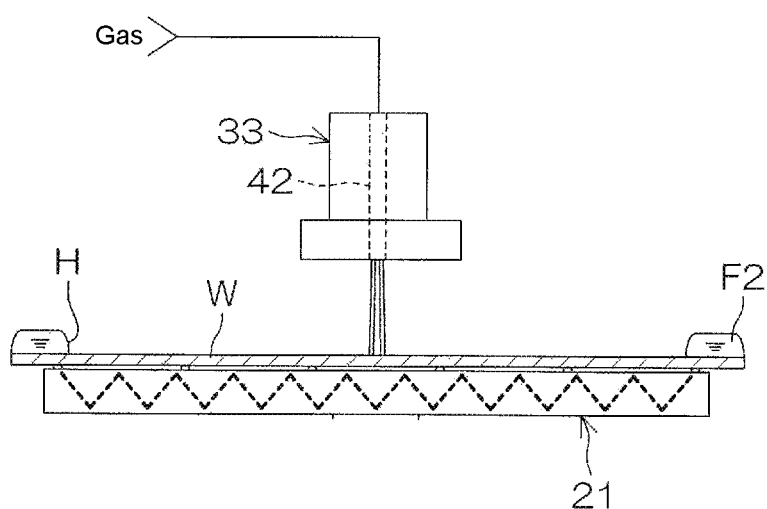
FIG. 7F is a schematic view showing the next state of FIG. 7E.

Thereafter, by further expanding the outer edge of the hole H, as shown in FIGS. 7F and 8D, the first liquid film F1 is removed from the substrate W, and only the second liquid film F2 in a ring shape remains on the upper surface of the substrate W. Thereafter, the control device 3 increases the opening degree of the flow rate adjusting valve 50 to further increase the flow rate of the gas discharged from the gas nozzle 42. In this example, the discharge flow rate of the gas increases gradually, for example, from 50 L/min to 80 L/min. In this way, the outer edge of the hole H (that is, the inner circumference of the second liquid film F2) gradually expands.

While the hole H is being expanded, the second liquid film F2 moves outward while maintaining the state where the side of the second liquid film F2 is surrounded by the first liquid film F1. Such movement of the first liquid film F1 and the second liquid film F2 is performed while maintaining the first vapor layer L1 and the second vapor layer L2 below, respectively. Therefore, a gas-liquid interface IF is continuously provided on the second liquid film F2. The height position of the lower surface of the floating second liquid film F2 is continuously kept high by the second vapor layer L2. Therefore, during a period in which the hole H is being expanded, the lower surface of the second liquid film F2 may be continuously disposed above the upper end of the pattern P1 even at the gas-liquid interface IF. Therefore, over the entire period when the hole H is being expanded, the pattern P1 does not come into contact with the second liquid at the gas-liquid interface IF.

By expanding the hole H to the entire upper surface of the substrate W, the first liquid and the second liquid are removed from the upper surface of the substrate W. As described above, the frictional resistances acting on the first liquid film F1 and the second liquid film F2 on the substrate W are both so small that they may be regarded as zero; therefore, the first liquid film F1 and the second liquid film F2 may be removed from the upper surface of the substrate W by a small force (a pressing force by the flow of the gas). There are no droplets with a visible size on the upper surface of the substrate W after the hole H has expanded over the entire area.

When a predetermined heating period has elapsed since the start of the disposition of the hot plate 21 on the upper position, the control device 3 controls the plate lifting unit 27 to lower the hot plate 21 to the lower position. During the process in which the hot plate 21 is lowered toward the lower position, the substrate W on the hot plate 21 is placed on the plurality of chuck pins 17, and the hot plate 21 separates from the substrate W downward. In this way, the substrate W is transferred from the hot plate 21 to the plurality of chuck pins 17. Thereafter, the substrate W is gripped by the plurality of chuck pins 17 by the driving of the chuck pin driving unit 20.

Next, a drying step (S11 in FIG. 6) of drying the substrate W by the high-speed rotation of the substrate W is performed.

Specifically, the control device 3 opens the gas valve 98 and starts the discharge of the gas from the gas discharge port 96 of the upper surface nozzle 33. In this way, a lateral annular airflow from the central part of the substrate W toward the outer peripheral part of the substrate W is formed above the substrate W. The upper surface of the substrate W is protected by a two-layer airflow which combines this annular airflow and a radial airflow formed by the gas discharged from the gas nozzle 42 and flowing outward along the upper surface of the substrate W. The discharge of the gas from the gas discharge port 96 of the upper surface nozzle 33 may be started before the start of the drying step (S11). For example, the discharge of the gas from the gas discharge port 96 may be started from the start of the first liquid supply step (S5) or may be started from the start of the second liquid supply step (S7).

Then, the control device 3 controls the spin motor 19 to rotate the substrate W at a high rotation speed (for example, several thousand rpm) higher than the rinse liquid supply speed. Even if droplets of the first liquid and droplets of the second liquid remain on the upper surface of the substrate W, these droplets are removed from the upper surface of the substrate W, and the substrate W is dried. When a predetermined time has elapsed since the high-speed rotation of the substrate W is started, the control device 3 controls the spin motor 19 to stop the rotation of the substrate W (S12 in FIG. 6).

Next, an unloading step (S13 in FIG. 6) of unloading the substrate W from the chamber 4 is performed.

Specifically, the control device 3 controls the guard lifting unit 57 to lower all the guards 54 to the lower position.

Further, the control device 3 closes the gas valve 49 and the gas valve 98 to stop the discharge of the gas from the gas nozzle 42 and the gas discharge port 96. Further, the control device 3 controls the nozzle moving unit 51 to retract the upper surface nozzle 33 to the standby position.

Thereafter, the center robot CR moves the hand H1 into the chamber 4. After the grip of the substrate W by the plurality of chuck pins 17 is released, the center robot CR supports the substrate W on the spin chuck 5 with the hand H1. Thereafter, the center robot CR retracts the hand H1 from the inside of the chamber 4 while supporting the substrate W with the hand H1. In this way, the substrate W that has been processed is unloaded from the chamber 4.

As described above, according to this embodiment, in the second liquid supply step (S7), the second liquid film F2 and the first liquid film F1 surrounding the side of the second liquid film F2 are formed on the upper surface of the substrate W. Then, in the vapor layer formation step (S8), by heating the substrate W, the second vapor layer L2 is formed by the evaporation of the second liquid in contact with the upper surface of the substrate W, and the second liquid film F2 is held on the second vapor layer L2. That is, the second liquid film F2 is held in a state of floating above the upper surface of the substrate W. Since the vapor pressure of the second liquid included in the second liquid film F2 is high, the film thickness of the second vapor layer L2 is large. Therefore, the height position of the lower surface of the floating second liquid film F2 may be kept high. Therefore, the lower surface of the second liquid film F2 may be disposed above the upper end of the pattern P1.

By blowing the gas to the floating second liquid film F2, a hole is formed in the second liquid film F2. In this way, the outer edge of the hole H, that is, the gas-liquid interface IF is formed. Then, by expanding the hole H toward the outer periphery of the substrate W, the second liquid film F2 is moved while floating and is removed to the outside of the substrate W. Since the frictional resistance acting on the second liquid film F2 on the substrate W is so small that it may be regarded as zero, the second liquid film F2 may be removed from the substrate W by a small force called the pressing force by the flow of the gas.

While the hole H is being expanded, the second liquid film F2 moves while maintaining the state where the side of the second liquid film F2 is surrounded by the first liquid film F1. Therefore, the gas-liquid interface IF is continuously provided on the second liquid film F2. Moreover, since the height position of the lower surface of the floating second liquid film F2 is kept high by the second vapor layer L2, during the period when the hole H is being expanded, the gas-liquid interface IF provided on the second liquid film F2 may be continuously disposed above the upper end of the pattern P1. Therefore, over the entire period when the hole H is being expanded, the pattern P1 may be prevented from coming into contact with the second liquid at the gas-liquid interface IF. In this case, over the entire period when the hole H is being expanded, the surface tension of the second liquid may be prevented from acting on the upper part of the pattern P1 at the gas-liquid interface IF. In this way, the substrate W may be dried while suppressing the collapse of the pattern P1.

Further, the surface tension of the second liquid is lower than the surface tension of the first liquid. That is, the surface tension of the first liquid included in the first liquid film F1 in a ring shape surrounding the side of the second liquid film F2 is high. The side of the second liquid film F2 is surrounded by the first liquid film F1, whereby the outflow of the second liquid from the substrate W is blocked by the first liquid film F1. In the entire liquid film including the first liquid film F1 and the second liquid film F2, the shape of the liquid film is kept by the surface tension of the liquid included in the outer peripheral part of the liquid film. Since the outer peripheral part of the entire liquid film is formed by the first liquid having a high surface tension, the shape of the liquid film may be kept for the entire liquid film including the first liquid film F1 and the second liquid film F2.

Assume a case where the liquid film on the substrate W is formed only by the second liquid film F2 without the first liquid film F1 provided, since the surface tension of the second liquid is low, it may not be possible to secure a sufficient heating time for forming a vapor layer having a sufficient thickness, and as a result, it may not be possible to float the liquid film on the substrate W well.

On the other hand, as in this embodiment, the side of the second liquid film F2 is surrounded by the first liquid film F1, whereby the film thickness of the second liquid film F2 may be made sufficiently thick. Since the film thickness of the second liquid film F2 is sufficiently thick, the second liquid film F2 may be heated for a sufficient time without forming unintended cracks or holes in the second liquid film F2, whereby the thickness of the second vapor layer L2 may be sufficiently thick. Therefore, the second liquid film F2 may be floated well.

Further, also assume a case where the height T (see FIG. 5) of the pattern P1 is high, and the upper end of the pattern P1 may be at the same height position as the lower surface of the floating second liquid film F2 or may be located above the lower surface. In this case, during the period when the hole H is being expanded, the pattern P1 keeps contacting the second liquid at the gas-liquid interface IF, and the surface tension of the second liquid acts on the upper part of the pattern P1 at the gas-liquid interface IF. However, since the surface tension of the second liquid is low, the surface tension acting on the pattern P1 is low. In this way, the collapse of the pattern P1 may be suppressed. Therefore, even in the case where the pattern P1 contacts the floating second liquid film F2, the substrate W may be dried while suppressing the collapse of the pattern P1.

Further, by replacing only a part of the first liquid on the upper surface of the substrate W with the second liquid, the first liquid film F1 in a ring shape remains at least on the outer peripheral part of the upper surface of the substrate W, and the second liquid gathers inside the first liquid film F1. In this way, the second liquid film F2 and the first liquid film F1 surrounding the side of the second liquid film F2 may be formed relatively easily on the upper surface of the substrate W.

Although one embodiment of the disclosure has been described above, the disclosure may be implemented in other forms.

Figure 9:
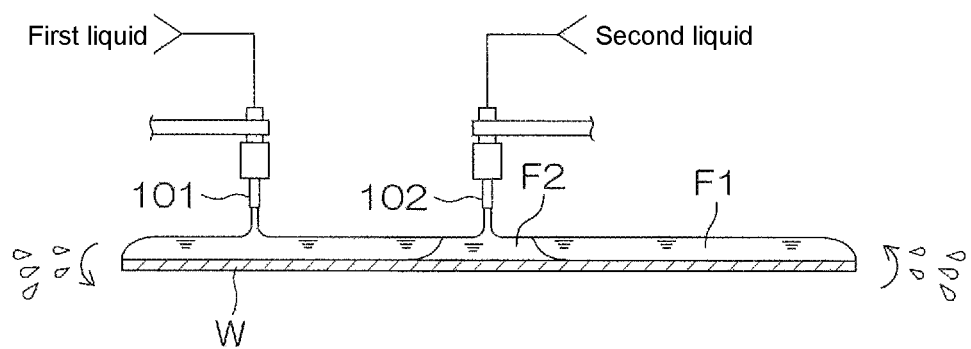
FIG. 9 is a schematic view for illustrating the first modified example.

For example, in the liquid film formation step, as shown in FIG. 9, by discharging liquids from two nozzles, that is, a first liquid nozzle 101 and a second liquid nozzle 102, the second liquid film F2 and the first liquid film F1 in a ring shape surrounding the side of the second liquid film F2 may be formed on the upper surface of the substrate W.

Specifically, while the substrate W is being rotated, the first liquid is discharged from the first liquid nozzle 101 toward the outer peripheral part of the upper surface of the substrate W, whereby the first liquid is supplied to the outer peripheral part of the upper surface of the substrate W. In this way, the first liquid film F1 in a ring shape is formed on the outer peripheral part of the upper surface of the substrate W. Moreover, the second liquid is discharged from the second liquid nozzle 102 different from the first liquid nozzle 101 toward the central part of the upper surface of the substrate W, whereby the second liquid is supplied to the upper surface of the substrate W. In this way, the second liquid film F2 in a circular shape is formed on the central part of the upper surface of the substrate W. That is, the supply of the first liquid for forming the first liquid film F1 and the supply of the second liquid for forming the second liquid film F2 may be realized by liquid discharge from different nozzles (the first liquid nozzle 101 and the second liquid nozzle 102). It may be considered that the supply of the first liquid from the first liquid nozzle 101 and the supply of the second liquid from the second liquid nozzle 102 are performed at the same time, but the supplies may be performed before or after each other.

Figure 10:
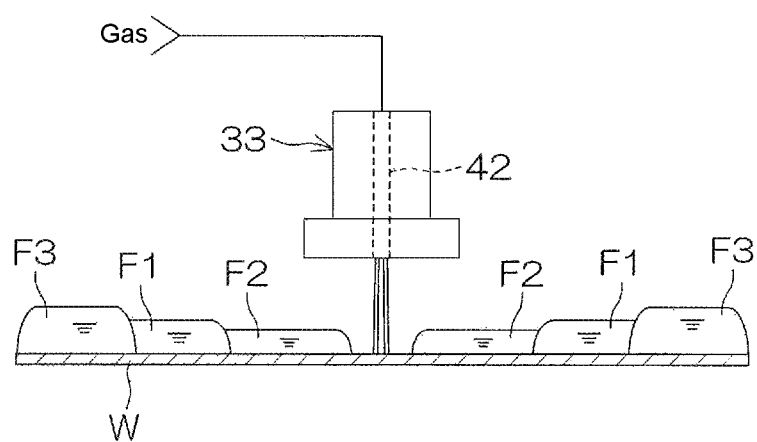
FIG. 10 is a schematic view for illustrating the second modified example.
Figure 11A:
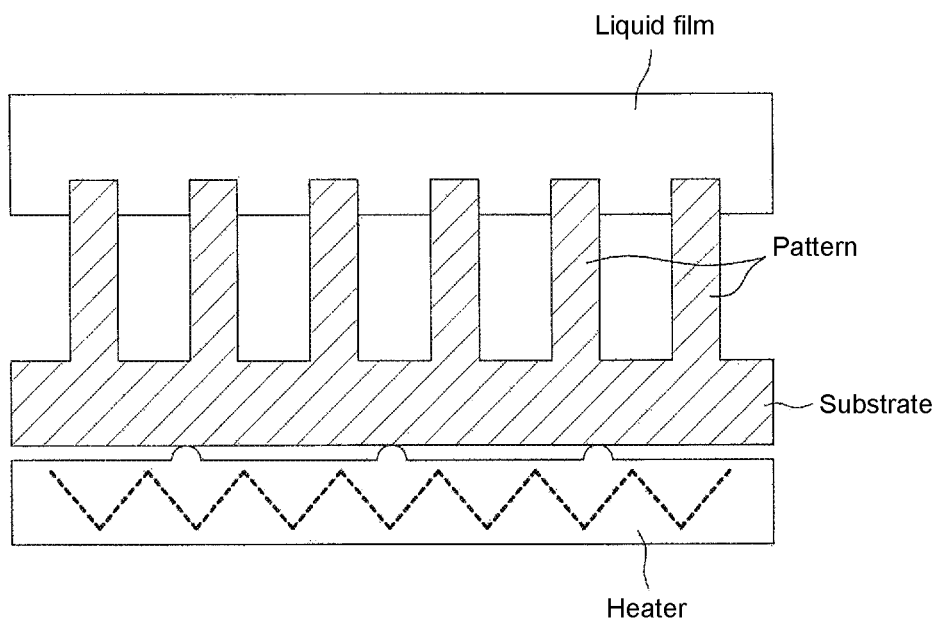
FIG. 11A is a schematic view showing a mechanism of the pattern collapse.
Figure 11B:
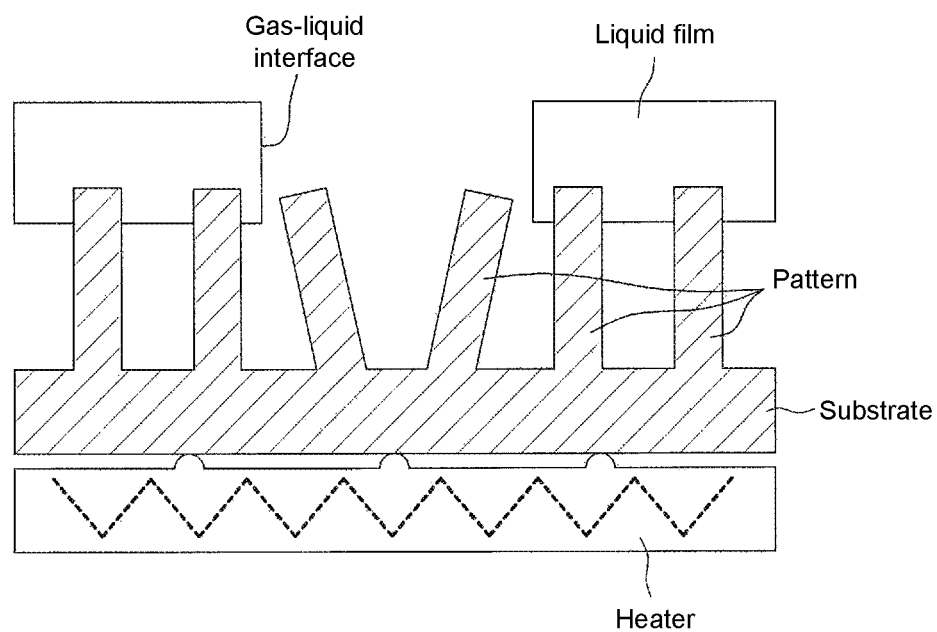
FIG. 11B is a schematic view showing a mechanism of the pattern collapse.

Further, in the liquid film formation step, instead of the liquid film including two kinds of liquids (the first liquid and the second liquid), the liquid film including three or more kinds of liquids may be formed. For example, as shown in FIG. 10, on the upper surface of the substrate W, the second liquid film (for example, an HFE liquid film) F2, the first liquid film (for example, an IPA liquid film) F1 in a ring shape surrounding the side of the second liquid film F2, and a third liquid film (a liquid film of a third liquid such as water (pure water)) F3 in a ring shape surrounding the side of the first liquid film F1 may be formed. The third liquid has a higher surface tension than the second liquid. In terms of the value of the surface tension, the second liquid<the first liquid<the third liquid.

Further, in the above-described embodiment, the first liquid is IPA, and the second liquid is HFE. However, for another combination of the first liquid and the second liquid, the first liquid may be water (vapor pressure under atmospheric pressure and at room temperature: 3.2 KPa; surface tension: 0.072 N/m; specific gravity: 1), and the second liquid may be IPA.

In addition, in the above-described embodiment, the vapor layer formation step may start heating the substrate W by the hot plate 21 before formation of the second liquid film F2 on the substrate W. Specifically, after the first liquid film F1 is formed on the upper surface of the substrate W, heating of the substrate W by the hot plate 21 is started. Thereafter, the second liquid film F2 is formed on the upper surface of the substrate W while the substrate W is being heated. Then, by keeping heating the substrate W, the first vapor layer L1 is formed between the first liquid and the upper surface of the substrate W, and the second vapor layer L2 is formed between the second liquid and the upper surface of the substrate W.

Further, in the above-described embodiment, the hot plate 21 may heat the substrate W not in a state of contacting the lower surface of the substrate W but in a state of being separated from the lower surface of the substrate W. Specifically, the plate lifting unit 27 lifts and lowers the hot plate 21 between a proximity position and the lower position. The proximity position is a position where the plurality of protruding parts 25 of the hot plate 21 face the lower surface of the substrate W at a predetermined distance. The substrate W is heated by the hot plate 21 disposed at the proximity position. The temperature of the substrate W may be changed by changing the heating temperature of the hot plate 21, or may be changed by changing the distance between the substrate W and the hot plate 21 (that is, changing the height position of the proximity position).

In this case, the substrate W may be rotated in the hole expansion step (S9). At this time, the hole H may be expanded by both the centrifugal force generated by the rotation of the substrate W and the pressing force generated by the gas discharged from the gas nozzle 42 and flowing outward along the surface of the second liquid film F2, or the hole H may be expanded only by the centrifugal force generated by the rotation of the substrate W without increasing the discharge flow rate of the gas in the hole expansion step (S9).

Further, in the hole expansion step (S9), the hole H may be expanded by moving the blowing position of the gas blown from the gas nozzle 42 onto the upper surface of the substrate W from the upper surface of the substrate W toward the outer peripheral part of the substrate W.

Further, in the hole expansion step (S9), the first liquid film F1 and the second liquid film F2 may be moved to the outer periphery of the substrate W (the hole H may be expanded) by providing a temperature gradient on the upper surface of the substrate W so that the central part of the substrate W has a higher temperature and the outer peripheral part of the substrate W has a lower temperature and causing a flow from the central part of the substrate W toward the outer peripheral part of the substrate W due to the temperature difference between the central part of the substrate W and the outer peripheral part of the substrate W. The temperature gradient on the upper surface of the substrate W may be realized, for example, by dividing the upper surface of the hot plate 21 into a plurality of areas and making the heating temperatures of these areas different.

In the above-described embodiment, a heater other than the hot plate 21 may be disposed below the substrate W. The heater may be a lamp, or may be other than the hot plate 21 and the lamp. The lamp may be an infrared lamp which emits infrared rays (for example, near infrared rays) or an LED lamp including a light emitting diode, or may be other than these.

Further, in the above-described embodiment, the case where the substrate processing device 1 is a device for processing a semiconductor wafer, which is an example of the substrate W, has been described. However, the substrate processing device may be a device for processing substrates such as liquid crystal display device substrates, substrates for flat panel display (FPD) such as an organic electroluminescence (EL) display device, optical disk substrates, magnetic disk substrates, magneto-optical disk substrates, photomask substrates, ceramic substrates, solar cell substrates, and the like.

Two or more of all the configurations described above may be combined. Two or more of all the steps described above may be combined.

Although the embodiments of the disclosure have been described in detail, these are only specific examples used for illustrating the technical contents of the disclosure, and the disclosure should not be construed as being limited to these specific examples, and the spirit and scope of the disclosure is limited only by the appended claims.

What is claimed is:

1. A substrate processing method, comprising:
   a liquid film formation step of supplying a first liquid and a second liquid having a vapor pressure higher than a vapor pressure of the first liquid to an upper surface of a substrate held horizontally, and forming, on the upper surface of the substrate, a second liquid film including the second liquid and a first liquid film including the first liquid and surrounding a side of the second liquid film;
   a vapor layer formation step of evaporating at least the second liquid in contact with the upper surface of the substrate by heating the substrate, forming a second vapor layer including vapor of the second liquid between the second liquid and the upper surface of the substrate, and holding the second liquid film on the second vapor layer in a state in which the second liquid film and the first liquid film surrounding the side of the second liquid film are existing on the upper surface of the substrate; and a gas blowing removal step of making a hole in the second liquid film by blowing a gas to the second liquid film to partially remove the second liquid after the second vapor layer is formed, further expanding the hole toward an outer periphery of the substrate, and removing the first liquid and the second liquid outside the substrate by moving the second liquid film on the second vapor layer, wherein the liquid film formation step includes supplying the second liquid to the upper surface of the substrate by discharging the second liquid toward the upper surface of the substrate covered with a liquid film including the first liquid with a rotation speed of the substrate being 0 to 10 rpm, and stopping a discharge of the second liquid before all of the first liquid is removed from the upper surface of the substrate.

2. The substrate processing method according to claim 1, wherein a surface tension of the second liquid is lower than a surface tension of the first liquid.

3. The substrate processing method according to claim 1, wherein the liquid film formation step comprises:

supplying the first liquid to the upper surface of the substrate; and supplying the second liquid to the upper surface of the substrate to replace only a part of the first liquid on the upper surface of the substrate with the second liquid.

4. The substrate processing method according to claim 1, wherein the liquid film formation step comprises:

discharging the first liquid from a first liquid nozzle toward an outer peripheral part of the upper surface of the substrate; and discharging the second liquid from a second liquid nozzle different from the first liquid nozzle toward a central part of the upper surface of the substrate.

5. The substrate processing method according to claim 1, wherein a specific gravity of the second liquid is larger than a specific gravity of the first liquid.

6. The substrate processing method according to claim 1, wherein the vapor layer formation step includes forming a first vapor layer including vapor of the first liquid between the first liquid and the upper surface of the substrate by evaporating the first liquid in contact with the upper surface of the substrate, and holding the first liquid film on the first vapor layer.

7. The substrate processing method according to claim 1, wherein the liquid film formation step includes:

discharging the second liquid to a central part of the upper surface of the substrate in a state where the first liquid film covers an entire upper surface of the substrate, so that the second liquid penetrates the first liquid film and collides with the central part of the upper surface of the substrate forming the second liquid film on the central part of the upper surface of the substrate and changing the first liquid film into a ring shape surrounding the second liquid film, by washing the first liquid on the central part of the upper surface of the substrate away outward along the upper surface of the substrate by the second liquid after colliding with the central part of the upper surface of the substrate;

increasing an outer diameter of the second liquid film gradually and decreasing a width of a ring of the first liquid film gradually, by continuing a discharge of the second liquid; and stopping the discharge of the second liquid in a state where the first liquid film is in the ring shape surrounding a side of the second liquid film.

\* \* \* \* \*